(12) United States Patent
Bang et al.

(10) Patent No.: US 11,940,845 B2
(45) Date of Patent: Mar. 26, 2024

(54) DISPLAY DEVICE

(71) Applicant: Samsung Display Co., LTD., Yongin-si (KR)

(72) Inventors: Ki Ho Bang, Hwaseong-si (KR); Hwa Jeong Kim, Hwaseong-si (KR); Yong Hwan Park, Cheonan-si (KR); Yong Je Jeon, Yongin-si (KR); Won Suk Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/132,505

(22) Filed: Apr. 10, 2023

(65) Prior Publication Data

US 2023/0273643 A1 Aug. 31, 2023

Related U.S. Application Data

(63) Continuation of application No. 16/819,821, filed on Mar. 16, 2020, now Pat. No. 11,625,069.

(30) Foreign Application Priority Data

Jul. 10, 2019 (KR) ........................ 10-2019-0083332

(51) Int. Cl.
*H01L 21/00* (2006.01)
*G06F 1/16* (2006.01)
*G06F 1/18* (2006.01)
*H10K 59/131* (2023.01)
*H10K 77/10* (2023.01)

(52) U.S. Cl.
CPC ............ *G06F 1/1652* (2013.01); *G06F 1/189* (2013.01); *H10K 59/131* (2023.02); *H10K 77/111* (2023.02)

(58) Field of Classification Search
CPC .. H10K 59/131; H10K 59/121; H10K 77/111; G06F 1/189
See application file for complete search history.

(56) References Cited

U.S. PATENT DOCUMENTS

| | | |
|---|---|---|
| 10,134,327 B2 | 11/2018 | Park et al. |
| 2008/0203391 A1 | 8/2008 | Kim et al. |
| 2010/0156769 A1 | 6/2010 | Chang |
| 2014/0022148 A1 | 1/2014 | Kim et al. |
| 2018/0197484 A1 | 7/2018 | Moon et al. |

*Primary Examiner* — Douglas M Menz
(74) *Attorney, Agent, or Firm* — CANTOR COLBURN LLP

(57) ABSTRACT

A display device includes a display panel which includes a display area and a non-display area, a plurality of signal wirings arranged in the display area, a plurality of fanout wirings arranged in the non-display area and electrically connected to the signal wirings, and a plurality of connecting wirings connecting the signal wirings to the fanout wirings, where some of the plurality of fanout wirings intersect and are overlapped with each other in a plan view.

19 Claims, 19 Drawing Sheets

DISPLAY DEVICE

This application is a continuation of U.S. patent application Ser. No. 16/819,821, filed on Mar. 16, 2020, which claims priority to Korean Patent Application No. 10-2019-0083332, filed on Jul. 10, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

An importance of display devices has increased with development of multimedia. Corresponding thereto, a variety of display devices such as liquid crystal displays ("LCDs"), organic light emitting displays ("OLEDs"), and the like are being used. Among the display devices, OLEDs are spontaneous emission devices and attract attention as next-generation display devices due to an excellent viewing angle thereof.

OLEDs each include a pixel circuit and a driving portion which drives the pixel circuit. The driving portion generally includes a scanning driving portion which provides a scanning signal to the pixel circuit, a data driving portion which provides a data signal to the pixel circuit, and the like. Driving circuits of the scanning driving portion and the data driving portion may be arranged in a non-display area adjacent to a display area, and the non-display area is a sort of dead space in view of functions of a display device.

SUMMARY

Exemplary embodiments of the invention provide a display device capable of minimizing a non-display area of the display device and improving display quality.

It should be noted that objects of the invention are not limited to the above-described objects, and other objects of the invention will be apparent to those skilled in the art from the following descriptions.

In some exemplary embodiments of the invention, a display device includes a display panel which includes a display area and a non-display area, a plurality of signal wirings arranged in the display area, a plurality of fanout wirings arranged in the non-display area and electrically connected to the signal wirings, and a plurality of connecting wirings connecting the signal wirings to the fanout wirings. Here, some of the plurality of fanout wirings intersect and are overlapped with each other in a plan view.

An exemplary embodiment provides a display device including a display panel which includes a display area and a non-display area, a plurality of signal wirings arranged in the display area, a plurality of fanout wirings arranged in the non-display area and electrically connected to the signal wirings, and a plurality of connecting wirings connecting the signal wirings to the fanout wirings, where some of the plurality of fanout wirings intersect and are overlapped with each other in a plan view.

In an exemplary embodiment, the display panel may include a bent region which is bent, and the plurality of fanout wirings intersect with each other in the non-display area between the display area and the bent region.

In an exemplary embodiment, one of the fanout wirings, which intersect with each other, contacts the signal wiring, and another of the fanout wirings may contact the connecting wiring.

In an exemplary embodiment, the fanout wiring in contact with the connecting wiring may include a first conductive layer, where the fanout wiring in contact with the signal wiring includes a second conductive layer, where the signal wiring includes a third conductive layer, and where the second conductive layer is disposed between the first conductive layer and the third conductive layer.

In an exemplary embodiment, the connecting wiring may include a fourth conductive layer, and the connecting wiring is electrically connected to the signal wiring through a contact hole which passes through an insulating layer disposed between the connecting wiring and the signal wiring and exposes one end of the signal wiring.

In an exemplary embodiment, the connecting wiring may include a first part extending in a first direction, a second part extending from one end of the first part in a second direction intersecting with the first direction, and a third part extending from one end of the second part in a direction opposite to the first direction, and where the first part is spaced apart from the third part.

In an exemplary embodiment, the display panel may include a bent region which is bent, a main region disposed on one side of the bent region, a subregion extending from the other side of the bent region, and the fanout wirings intersect with each other in the subregion.

An exemplary embodiment provides a display device including a display area and a non-display area, including first to fourth signal wirings arranged in the display area, first to fourth fanout wirings arranged in the non-display area and electrically connected to the first to fourth signal wirings, respectively, a first connecting wiring disposed in the display area and connecting the first signal wiring to the first fanout wiring, and a second connecting wiring disposed in the display area and connecting the second signal wiring to the second fanout wiring, where the second fanout wiring and a third fanout wiring intersect and are overlapped with each other in a plan view.

In an exemplary embodiment, the display device may include a first pixel and a second pixel arranged in the display device, where the first signal wiring and the second signal wiring are connected to the first pixel, and where the third signal wiring and the fourth signal wiring are connected to the second pixel.

In an exemplary embodiment, the first pixel and the second pixel each may include first to third subpixels which emit different colors from each other, where the first signal wiring is connected to the first subpixel and the third subpixel of the first pixel, where the second signal wiring is connected to the second subpixel of the first pixel, where the third signal wiring is connected to the first subpixel and the third subpixel of the second pixel, and where the fourth signal wiring is connected to the second subpixel of the second pixel.

In an exemplary embodiment, the first to fourth fanout wirings may include first to fourth main fanout wirings connected to the signal wirings or the connecting wirings, and first to fourth subfanout wirings spaced apart from the first to fourth main fanout wirings, respectively.

In an exemplary embodiment, the first to fourth fanout wirings further may include bent fanout wirings which connect the first to fourth main fanout wirings to the first to fourth subfanout wirings, respectively In an exemplary embodiment, the bent fanout wirings may be arranged in the same layer as that of the connecting wirings.

In an exemplary embodiment, the second main fanout wiring and the third main fanout wiring may intersect and be overlapped with each other in a thickness direction.

In an exemplary embodiment, the second main fanout wiring and the third main fanout wiring may be disposed in different layers.

In an exemplary embodiment, the second main fanout wiring and the second subfanout wiring may be arranged in the same layer.

In an exemplary embodiment, the third main fanout wiring and the third subfanout wiring may be arranged in a same layer.

In an exemplary embodiment, the second subfanout wiring and the third subfanout wiring may intersect and be overlapped with each other in a thickness direction.

In an exemplary embodiment, the second subfanout wiring and the third subfanout wiring may be disposed in different layers.

In an exemplary embodiment, the second main fanout wiring and the fourth main fanout wiring may include a first conductive layer, where the first main fanout wiring and the third main fanout wiring include a second conductive layer, where the signal wirings include a third conductive layer, and where the second conductive layer is disposed between the first conductive layer and the third conductive layer.

BRIEF DESCRIPTION OF THE DRAWINGS

The above and other exemplary embodiments and features of the invention will become more apparent by describing exemplary embodiments thereof in detail with reference to the attached drawings, in which.

DETAILED DESCRIPTION

Figure 1:
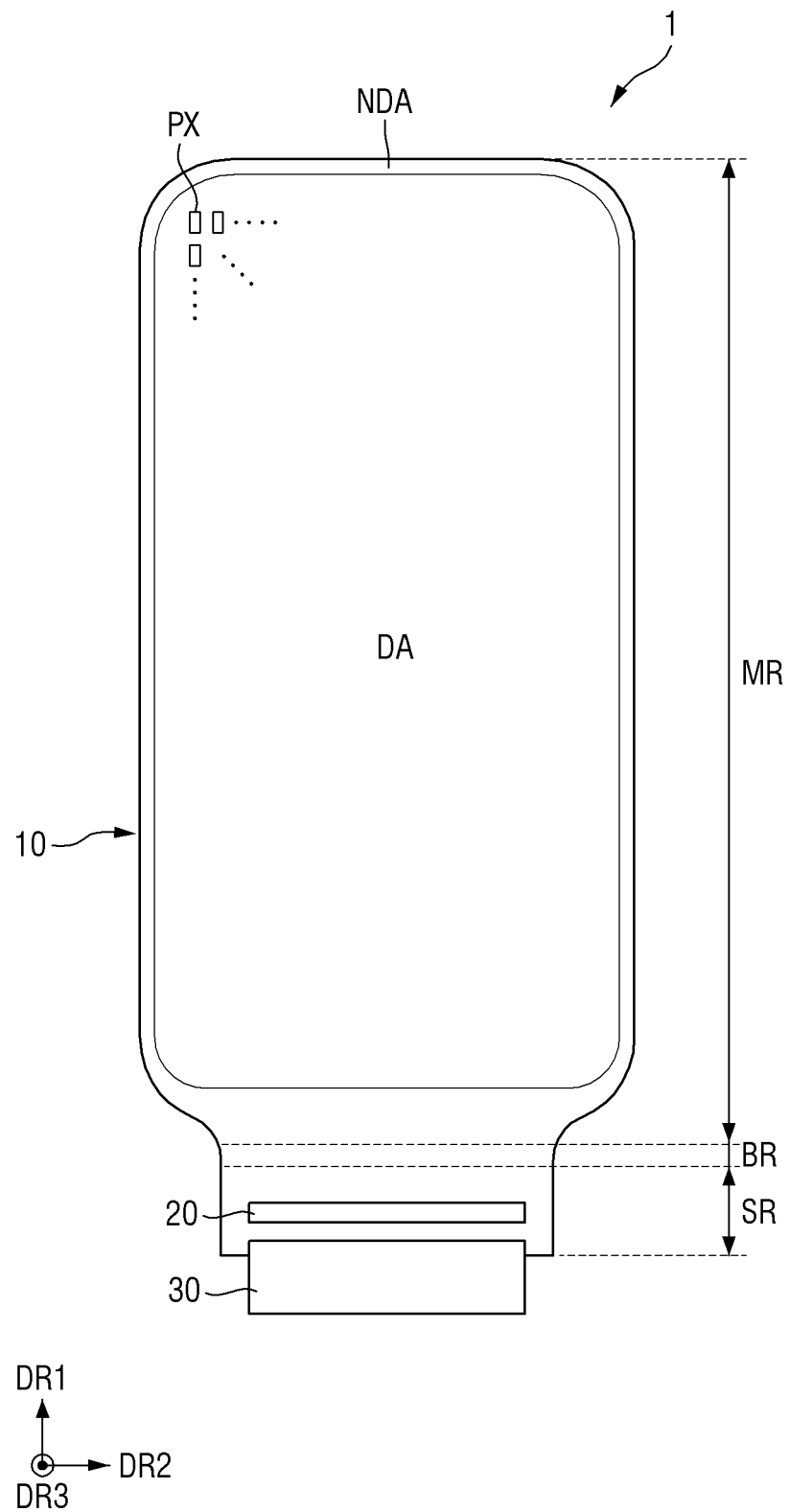
FIG. 1 is a plan view of an exemplary embodiment of a display device according to the invention.

Advantages and features of the invention and schemes of accomplishing the same will be understood more readily with reference to the following detailed description of embodiments taken in conjunction with the accompanying drawings. However, the invention may be embodied in various other forms and should not be construed as being limited to the exemplary embodiments set forth herein. The exemplary embodiments disclosed herein are provided so that the invention of the invention will be thorough and complete and will fully convey the scope of the invention to those of ordinary skill in the art to which the invention pertains. In addition, the invention will only be defined by the scope of the appended claims.

It will be understood that when an element or layer is referred to as being "on" another element or layer, the element or layer may be directly on another element, or intervening elements or layers may be present. Like reference numerals refer to like elements throughout the specification.

Although the terms such as "first" and "second" are used herein to describe various elements, it will be understood that these elements are not limited by the terms. These terms are used only to distinguish one element from another element. Thus, a first element discussed below could be termed as a second element without departing from the technical idea of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the drawings.

In the specification, a first direction DR1 indicates a Y-axis direction, a second direction DR2 indicates an X-axis direction, and a third direction DR3 indicates a Z-axis direction.

Figure 2:
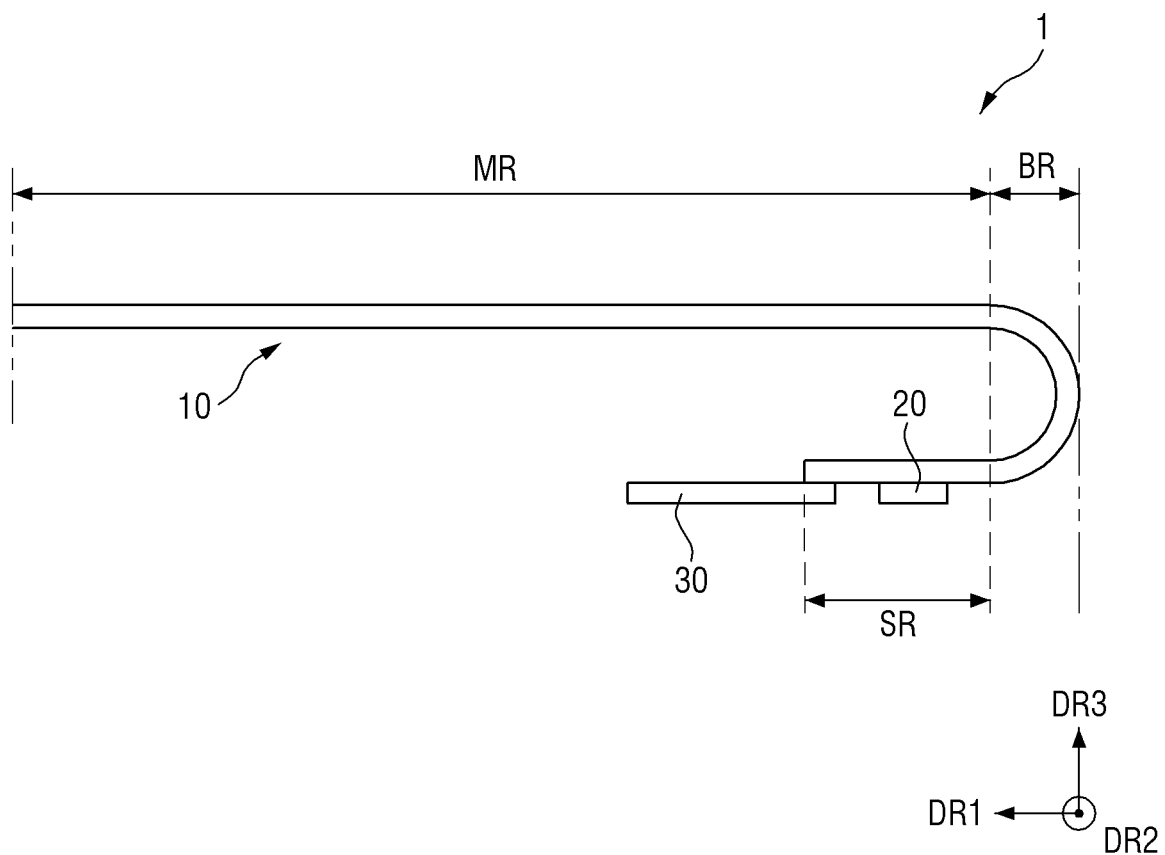
FIG. 2 is a side view of the display device of FIG. 1.
Figure 3:
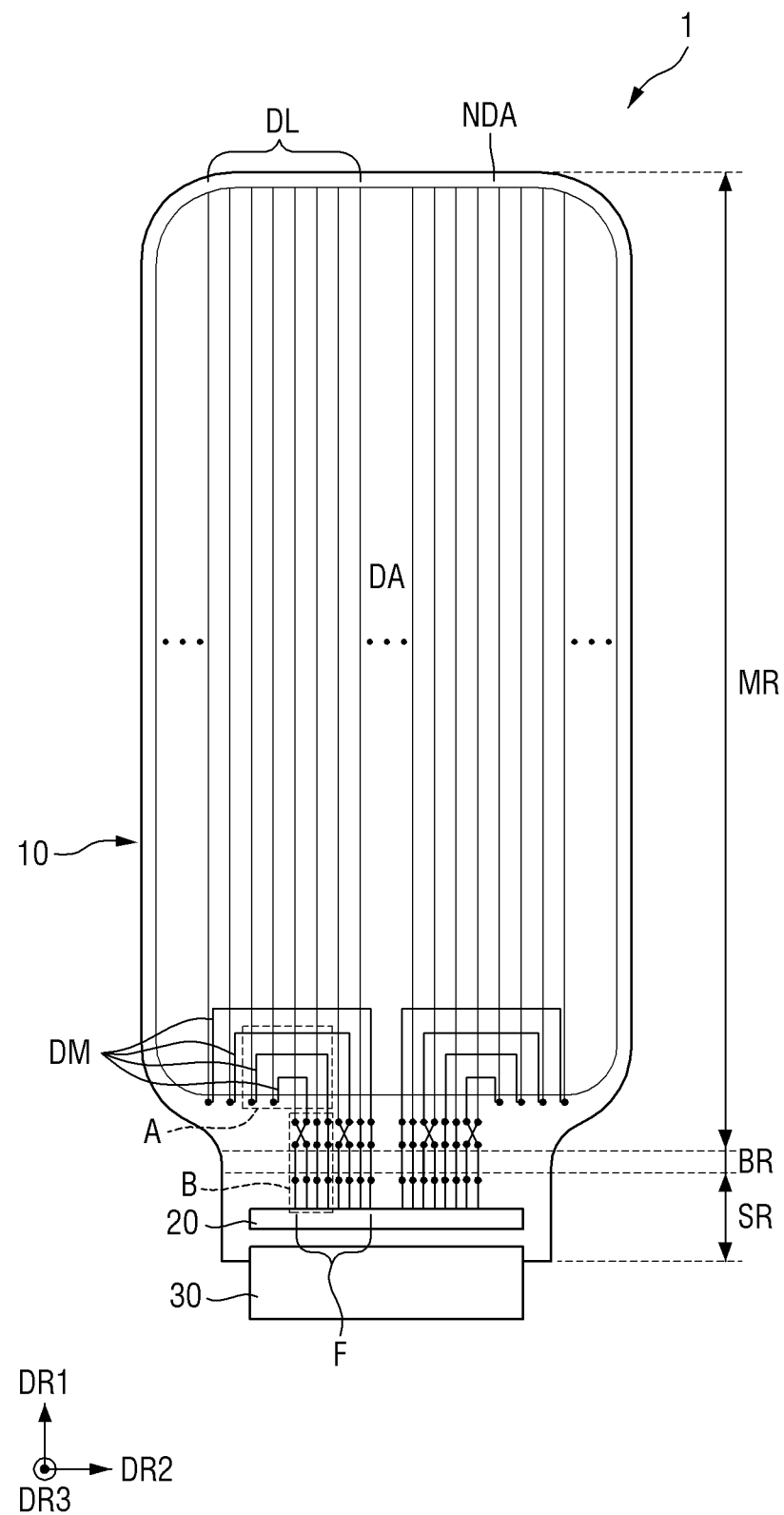
FIG. 3 is a plan view illustrating signal wirings, connecting wirings, and fanout wirings of the display device of FIG. 1.
Figure 4:
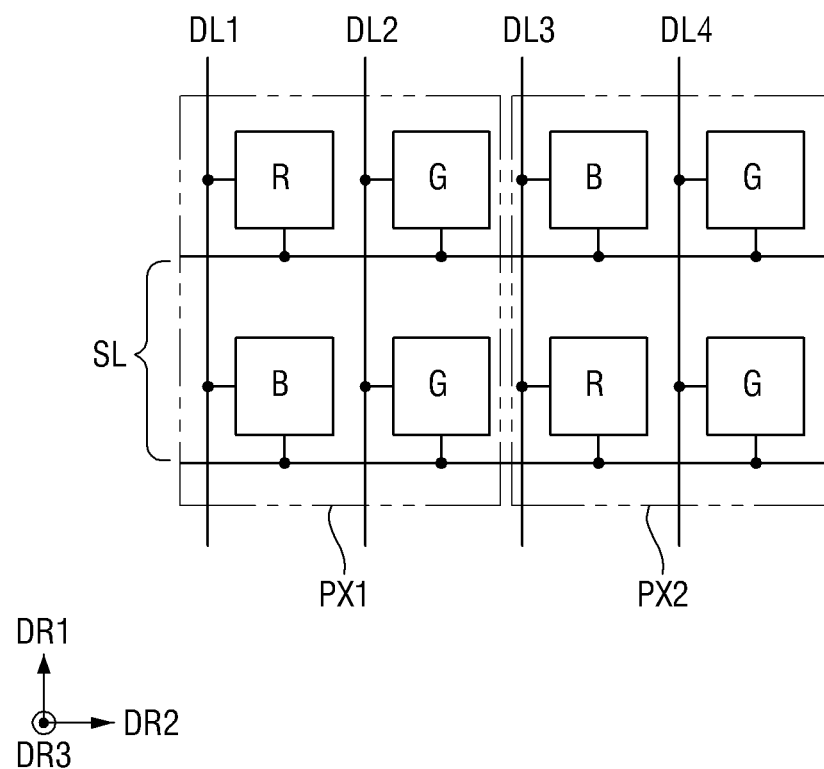
FIG. 4 is an example view illustrating subpixel arrangements of a first pixel and a second pixel of the display device of FIG. 1.
Figure 5:
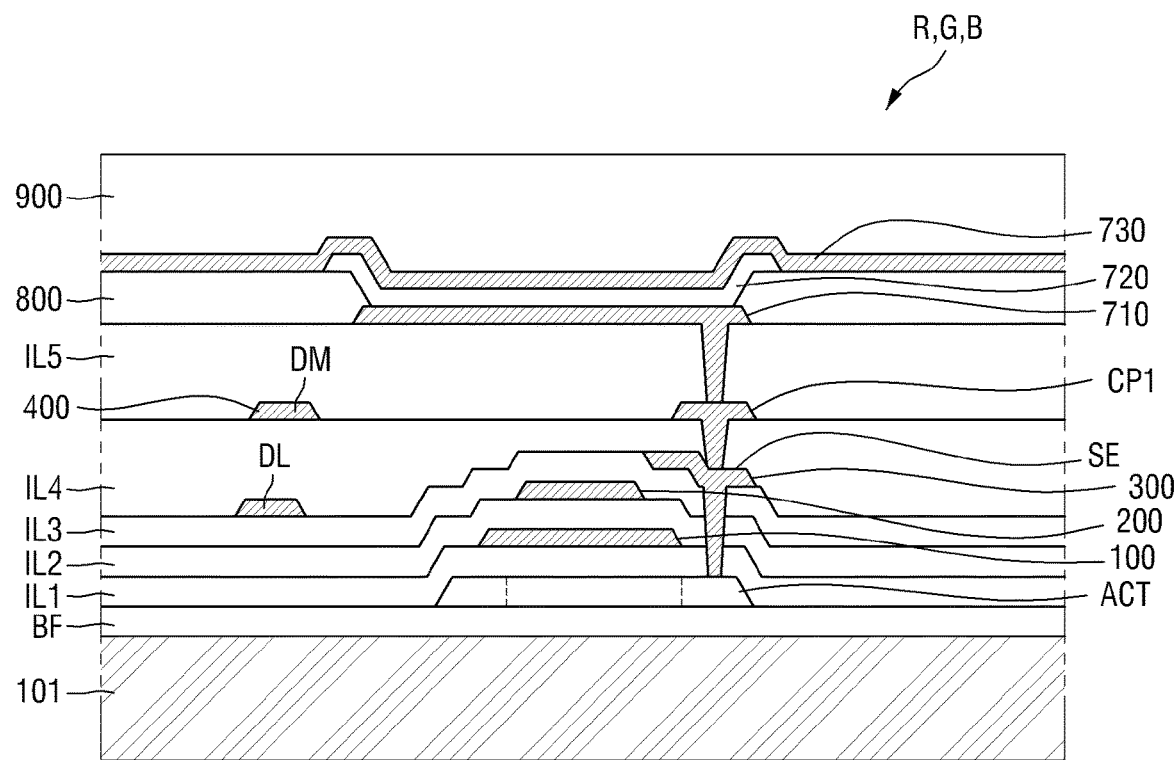
FIG. 5 is a cross-sectional view illustrating an exemplary embodiment of a subpixel of the display device according to the invention.
Figure 6:
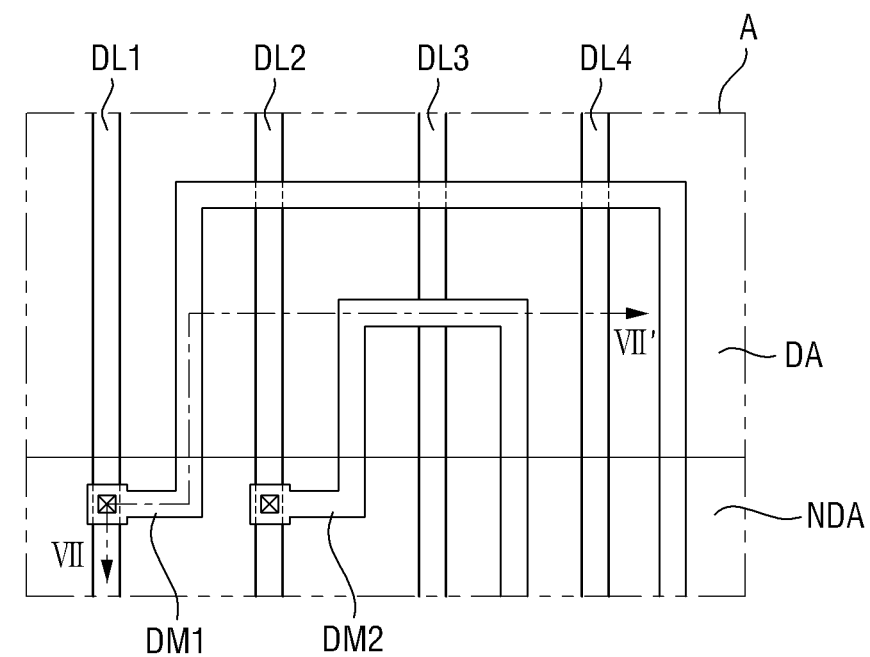
FIG. 6 is an enlarged plan view illustrating area A of FIG. 3.
Figure 7:
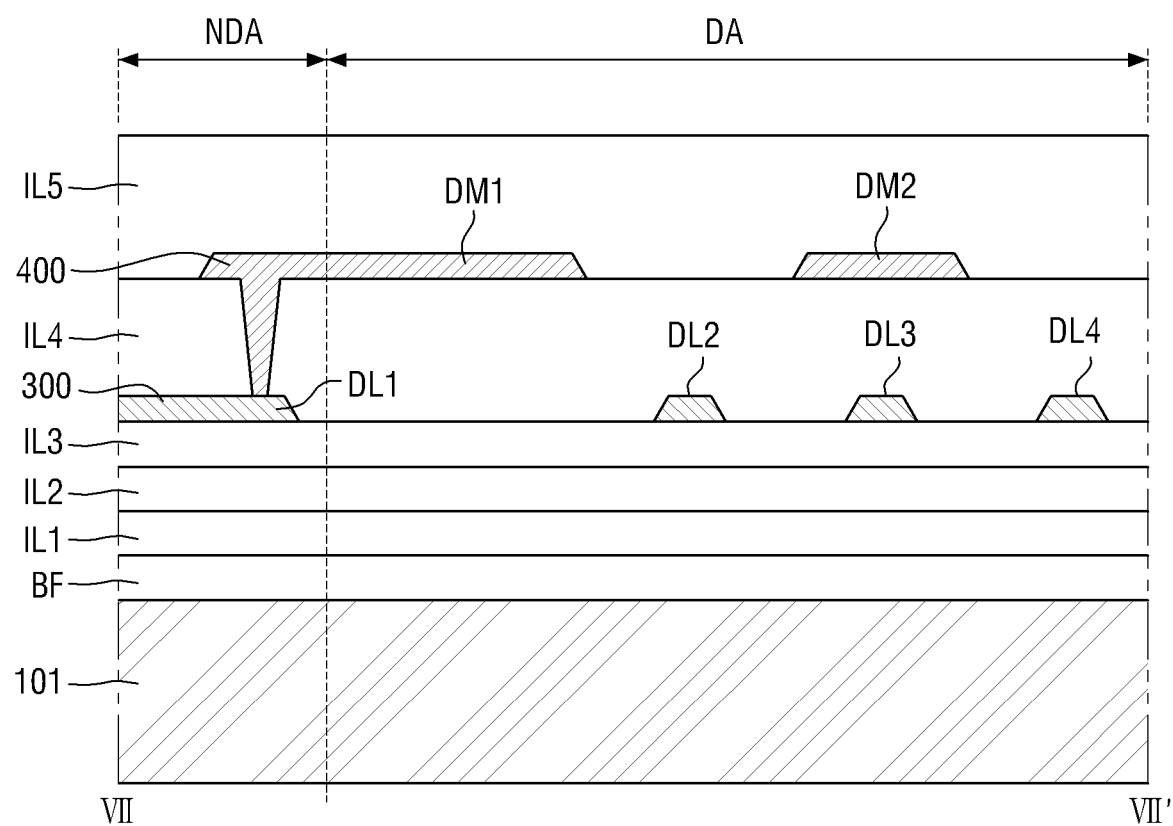
FIG. 7 is a cross-sectional view taken along line VII-VII of FIG. 6.
Figure 8:
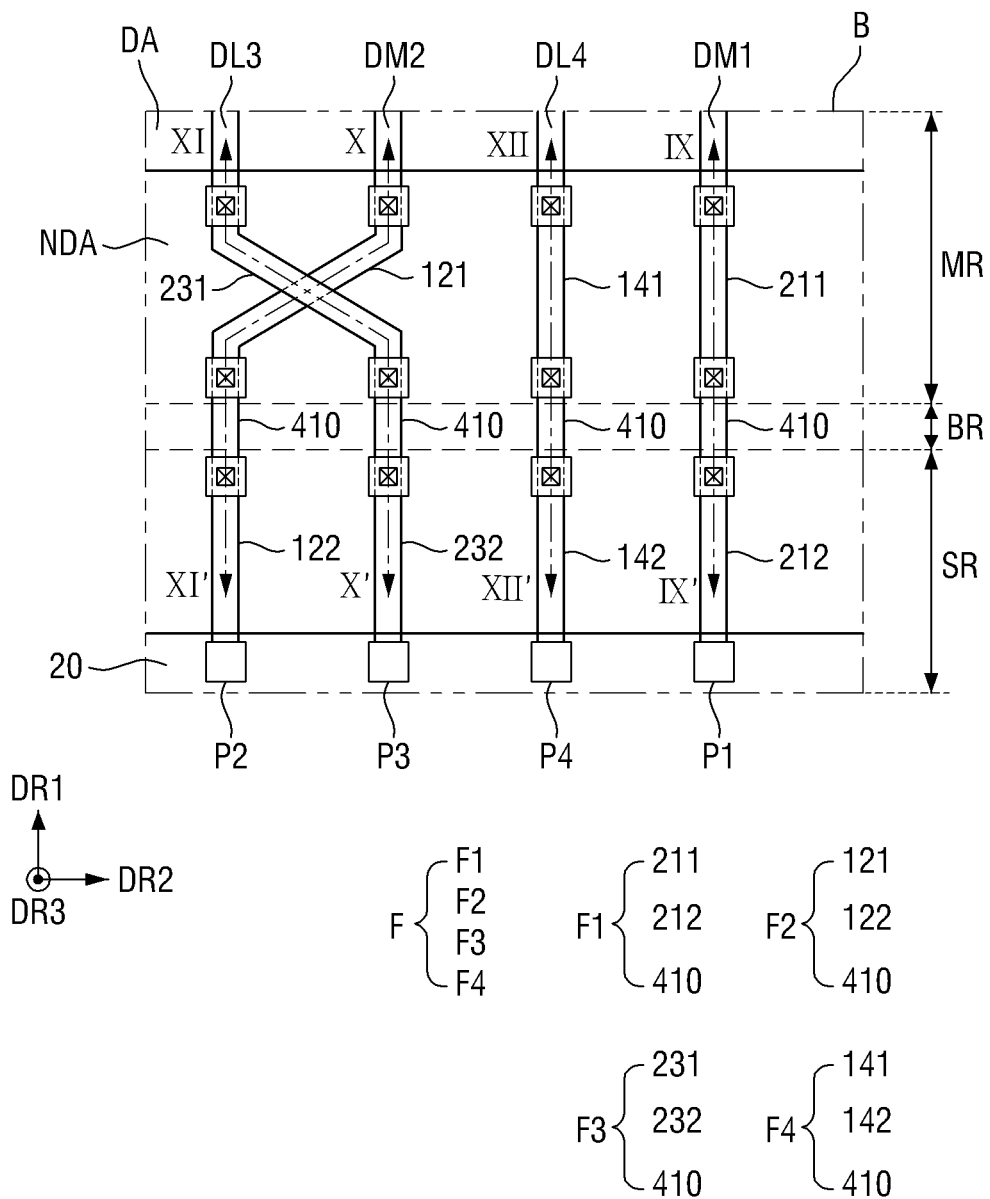
FIG. 8 is an enlarged plan view illustrating area B of FIG. 3.
Figure 9:
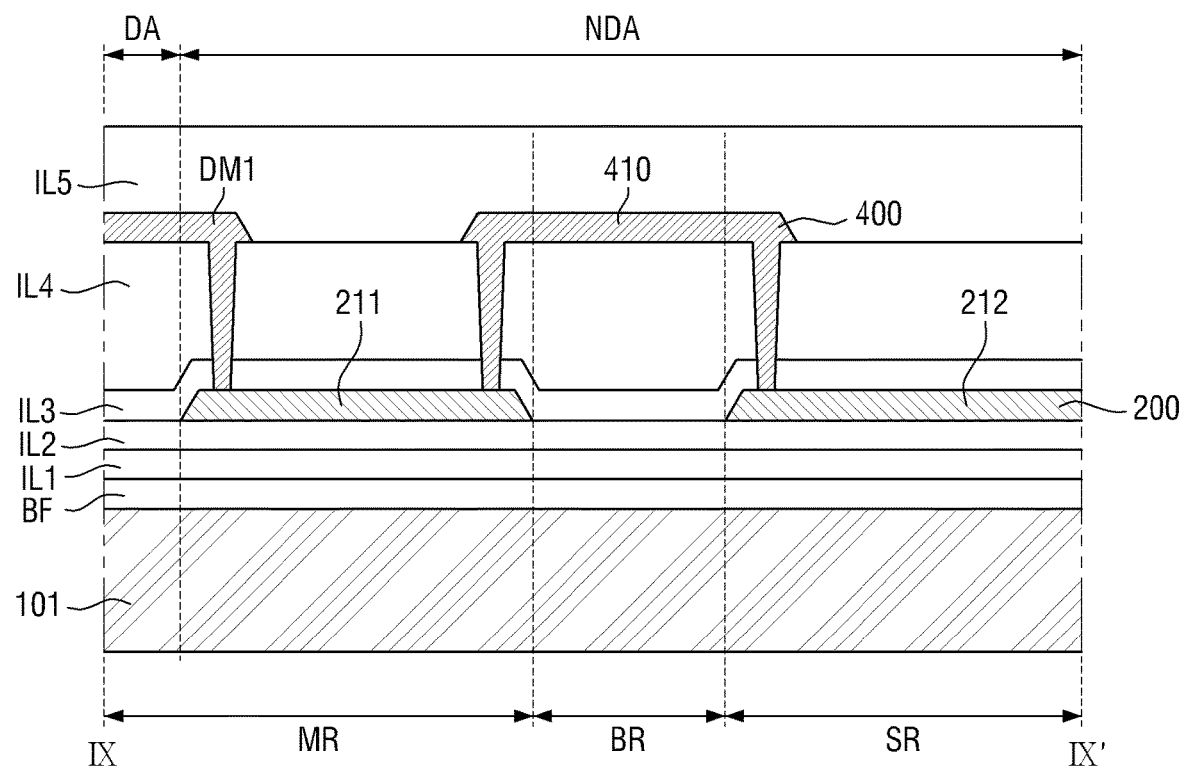
FIG. 9 is a cross-sectional view taken along line IX-IX' of FIG. 8.
Figure 10:
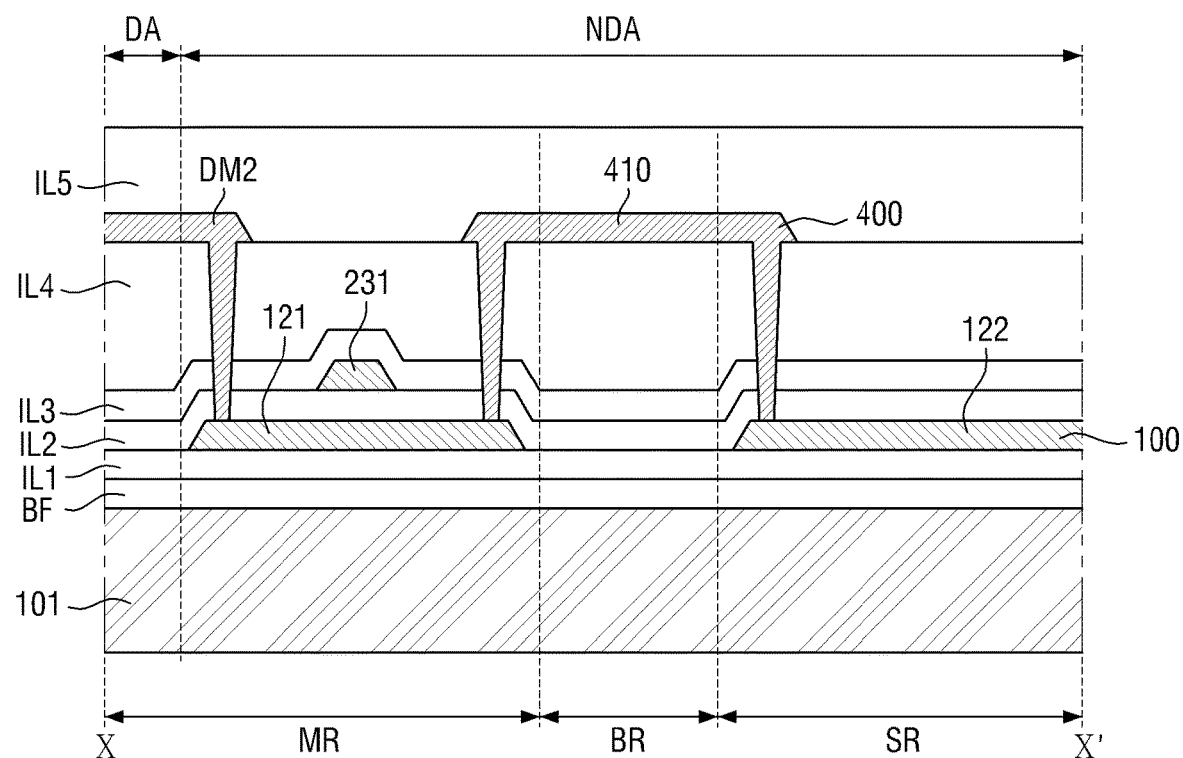
FIG. 10 is a cross-sectional view taken along line X-X' of FIG. 8.
Figure 11:
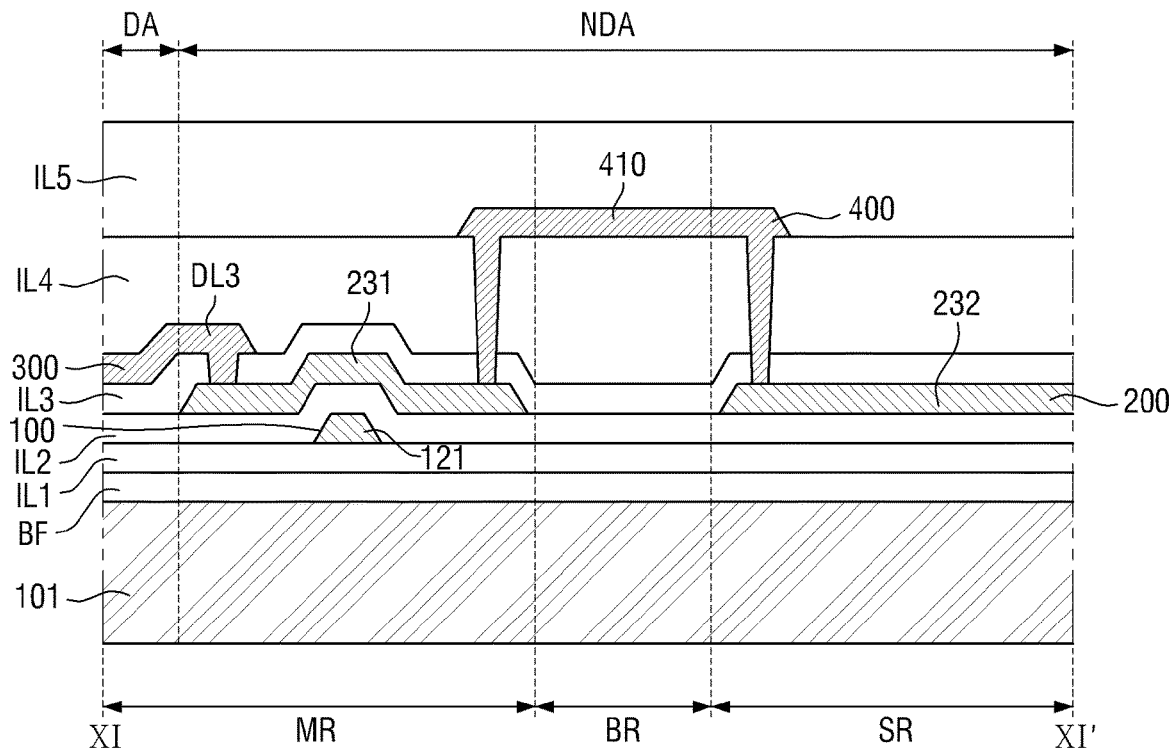
FIG. 11 is a cross-sectional view taken along line XI-XI' of FIG. 8.
Figure 12:
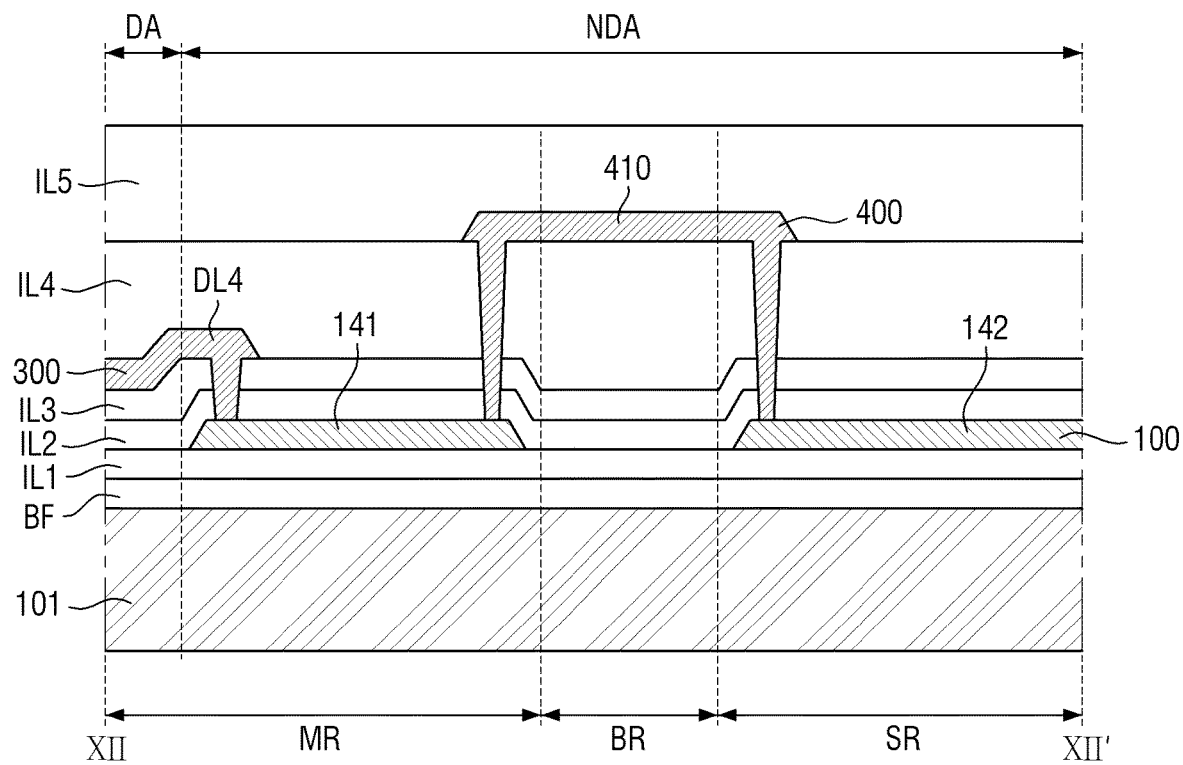
FIG. 12 is a cross-sectional view taken along line XII-XII' of FIG. 8.

FIG. 1 is a plan view of an exemplary embodiment of a display device according to the invention. FIG. 2 is a side view of the display device of FIG. 1. FIG. 3 is a plan view illustrating a signal wiring, a connecting wiring, and a fanout wiring of the display device of FIG. 1. FIG. 4 is an example view illustrating subpixel arrangements of a first pixel and a second pixel of the display device of FIG. 1. FIG. 5 is a cross-sectional view illustrating an exemplary embodiment of a subpixel of the display device according to the invention. FIG. 6 is an enlarged plan view illustrating area A of FIG. 3. FIG. 7 is a cross-sectional view taken along line VII-VII of FIG. 6. FIG. 8 is an enlarged plan view illustrating area B of FIG. 3. FIG. 9 is a cross-sectional view taken along line IX-IX' of FIG. 8. FIG. 10 is a cross-sectional view taken along line X-X' of FIG. 8. FIG. 11 is a cross-sectional view taken along line XI-XI' of FIG. 8. FIG. 12 is a cross-sectional view taken along line XII-XII' of FIG. 8.

Referring to FIGS. 1 to 12, a display device 1 is a device which displays a moving picture or a still image and may be used as a display screen of a variety of products such as portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation system, an ultra-mobile PC, and the like and also such as a television, a laptop PC, a monitor, an advertising panel, an Internet of Things ("IoT"), and the like.

The display device 1 may include a display panel 10. The display panel 10 may be a flexible substrate including a flexible polymer material such as polyimide and the like. Accordingly, the display panel 10 may be deformable, e.g., curled, bent, folded, or rolled.

The display panel 10 may include a display area DA that is a part displaying an image and a non-display area NDA in addition to the display area DA. The display area DA may include a plurality of pixels PX.

The pixels PX indicate a group of subpixels capable of expressing gradation. Each of the pixels PX may include a plurality of subpixels R, G, and B. The subpixels R, G, and B may include a first subpixel R emitting a first color, a second subpixel G emitting a second color, and a third subpixel B emitting a third color. One first subpixel R, two second subpixels G, and one third subpixel B may be defined as one pixel P.

In an exemplary embodiment, as shown in FIG. 4, the pixel PX may include a first pixel PX1 and a second pixel PX2, for example. The first subpixel R and the second subpixel G may be arranged along the second direction DR2 in a first row of the first pixel PX1, and the third subpixel B and the second subpixel G may be arranged along the second direction DR2 in a second row of the first pixel PX1. The subpixels R and G arranged in the first row of the first pixel PX1 may be connected to a first scanning line SL1, and the subpixels B and G arranged in the second row of the first pixel PX1 may be connected to a second scanning line SL2. Also, the subpixels R and B arranged in a first column of the first pixel PX1 may be connected to a first signal wiring DL1, and the subpixels G arranged in a second column of the first pixel PX1 may be connected to a second signal wiring DL2.

Also, the third subpixel B and the second subpixel G may be arranged along the second direction DR2 in a first row of the second pixel PX2, and the first subpixel R and the second subpixel G may be arranged along the second direction DR2 in a second row of the second pixel PX2. The subpixels B and G arranged in the first row of the second pixel PX2 may be connected to the first scanning line SL1, and the subpixels R and G arranged in the second row of the second pixel PX2 may be connected to the second scanning line SL2. Also, the subpixels B and R arranged in a first column of the second pixel PX2 may be connected to a third signal wiring DL3, and the subpixels G arranged in a second column of the second pixel PX2 may be connected to a fourth signal wiring DL4. A detailed description of the first to fourth signal wirings DL1, DL2, DL3, and DL4 will be described below with reference to FIGS. 5 to 12.

The display panel 10 may include a main region MR and a bent region BR connected to one side of the main region MR. The display panel 10 may further include subregions SR connected to the bent region BR and overlapped with the main region MR in a thickness direction when the bent region BR is bent.

The main region MR may include the display area DA. A peripheral edge part of the display area DA of the main region MR may be the non-display area NDA.

The main region MR may have a shape similar to an external planar shape of the display device 1. The main region MR may be a planarized area disposed on one surface. However, the invention is not limited thereto, and at least one of edges of the main region MR excluding an edge (side) connected to the bent region BR may be curled to form a curve or may be bent in a vertical direction.

When at least one of the edges of the main region MR excluding the edge (side) connected to the bent region BR forms a curve or is bent, the display area DA may be disposed on the corresponding edge. However, the invention is not limited thereto, the non-display area NDA, which does not display an image, may be disposed on the curved or bent edge. Alternatively, the display area DA and the non-display area NDA may be arranged together on the curved or bent edge.

The non-display area NDA of the main region MR may be disposed in an area from an outer boundary of the display area DA to an edge of the display panel 10. In the non-display area NDA of the main region MR, signal wirings DL may be arranged which apply signals to the display area DA, the connecting wirings DM, or driving circuits. Also, an outermost black matrix may be disposed in the non-display area NDA of the main region MR, but the invention is not limited thereto.

The bent region BR is connected to the main region MR. In an exemplary embodiment, the bent region BR may be connected through one short side of the main region MR, for example. In the bent region BR, the display panel 10 may be bent at a curvature in a direction opposite to the third direction DR3, that is, a direction opposite to a display surface. As the display panel 10 is bent in the bent region BR, a surface of the display panel 10 may be reversed. That is, one surface of the display panel 10 facing upward may face outside through the bent region BR and then be switched again to face downward.

The subregion SR extends from the bent region BR. The subregion SR may start after a point where the bending is completed and extend in a direction parallel to the main region MR. The subregion SR may be overlapped with the main region MR in the third direction DR3, that is, the thickness direction of the display panel 10. The subregion SR may be overlapped with the non-display area NDA of the edge of the main region MR and may additionally be overlapped with the display area DA of the main region MR.

A driving chip 20 (or a driving chip and a pad portion electrically connected to the driving chip) may be disposed in the subregion SR of the display panel 10. The driving chip 20 may generate a driving signal necessary for driving the pixel PX and may provide the pixel PX defined in the display area DA with the driving signal. In an exemplary embodiment, the driving chip 20 may generate a data signal that determines light-emitting brightness of the pixel PX, for example. In this case, the driving chip 20 may provide the pixel PX with the data signal through the connecting wiring DM and the signal wiring DL.

The driving chip 20 may be attached to the display panel 10 through an anisotropic conductive film or through ultrasonic bonding. A width of the driving chip 20 in the second direction DR2 may be smaller than a width of the display panel 10 in the second direction DR2.

The driving chip 20 may include a plurality of output terminals P1, P2, P3, and P4, which are sequentially arranged along the second direction DR2. When terminal numbers are assigned on the basis of the signal wirings DL1, DL2, DL3, and DL4 corresponding to the plurality of output terminals P1, P2, P3, and P4, a second output terminal P2, a third output terminal P3, a fourth output terminal P4, and a first output terminal P1 may be sequentially arranged along the second direction DR2.

A driving substrate 30 may be connected to an end of the subregion SR of the display panel 10. The pad portion may be provided at the end of the subregion SR, and the driving substrate 30 may be connected to the pad portion. In an exemplary embodiment, the driving substrate 30 may be a flexible printed circuit board ("FPCB") or a film, for example.

A plurality of such signal wirings DL and connecting wirings DM may be arranged in the display area DA of the main region MR. A plurality of fanout wirings F may be arranged in the non-display area NDA, the bent region BR, and the subregion SR of the main region MR. The connecting wirings DM may connect some of the signal wirings DL to some of the fanout wirings F. That is, the fanout wirings F may be electrically connected to the signal wirings DL by the connecting wirings DM.

The plurality of signal wirings DL, the plurality of connecting wirings DM, and the plurality of fanout wirings F will be described in detail with reference to FIGS. 4 to 12.

Referring to FIGS. 4 to 12, the display device 1 may include the plurality of signal wirings DL, the plurality of connecting wirings DM, and the plurality of fanout wirings F.

An arrangement configuration of the signal wirings DL, the connecting wirings DM, and the fanout wirings F may extend in the first direction DR1 or the second direction DR2 and may be symmetrical on the basis of a reference axis (not shown) passing through an areal center of the display device 1. Hereinafter, the signal wirings DL, the connecting wirings DM, and the fanout wirings F, which are arranged on a left side of the display device 1 and connected to the first pixel PX1 and the second pixel PX2 will be mainly described.

The plurality of signal wirings DL may extend from the non-display area NDA of the main region MR and be arranged in the display area DA. The signal wirings DL may extend in the first direction DR1 and may be sequentially arranged at particular intervals along the second direction DR2. The second direction DR2 is a direction intersecting with the first direction DR1 and may be perpendicular to the first direction DR1.

One ends of the signal wirings DL may be electrically connected to the connecting wirings DM. The one ends of the signal wirings DL, which are connected to the connecting wirings DM, may be arranged in the non-display area NDA at a bottom of the main region MR. The signal wirings DL may be, for example, data lines which transmit data signals to the plurality of pixels PX.

In an exemplary embodiment, the first signal wiring DL1 may transmit a first data signal to the first subpixel R and the third subpixel B of the first pixel PX1, for example. Also, the second signal wiring DL2 may transmit a second data signal to the second subpixel G of the first pixel PX1. Also, the third signal wiring DL3 may transmit a third data signal to the first subpixel R and the third subpixel B of the second pixel PX2. Also, the fourth signal wiring DL4 may transmit a fourth data signal to the second subpixel G of the second pixel PX2.

The plurality of connecting wirings DM may extend from the non-display area NDA of the main region MR to the display area DA and return to the non-display area NDA. The plurality of connecting wirings DM may be electrically connected to the plurality of signal wirings DL in the non-display area NDA of the main region MR, respectively. In an exemplary embodiment, as shown in FIG. 6, a first connecting wiring DM1 may be connected to the first signal wiring DL1 and a second connecting wiring DM2 may be connected to the second signal wiring DL2, for example.

The connecting wirings DM are arranged in a layer different from a layer in which the signaling wirings DL are arranged, and the connecting wirings DM may be insulated from the signal wirings DL by an insulating layer. In an exemplary embodiment, as shown in FIGS. 5 and 8, the signal wirings DL1, DL2, DL3, and DL4 may include a third conductive layer 300, the connecting wirings DM1 and DM2 may include a fourth conductive layer 400, and the connecting wirings DM1 and DM2 may be insulated from the signal wirings DL1, DL2, DL3, and DL4 by a fourth insulating layer IL4, for example. The first connecting wiring DM1 may be electrically connected to the first signal wiring DL1 through a contact hole which passes through the fourth insulating layer IL4 and exposes one end of the first signal wiring DL1, and the second connecting wiring DM2 may be electrically connected to the second signal wiring DL2 through a contact hole which passes through the fourth insulating layer IL4 and exposes one end of the second signal wiring DL2.

The plurality of connecting wirings DM may each include a first part extending from the non-display area NDA in the first direction DR1, a second part extending from one end of the first part in the second direction DR2, and a third part extending from one end of the second part in a direction opposite to the first direction DR1. The one end of the first part disposed in the non-display area NDA may be electrically connected to the one end of the signal wiring DL as described above. The first part and the third part may be arranged to be spaced apart from each other, and the second part may be disposed between the first part and the third part.

As described above, the display device 1 may include the connecting wiring DM which is disposed via the display area DA, and an image signal may be provided to the signal wiring DL through the connecting wiring DM. Accordingly, an additional dead space desired to directly connect the signal wiring DL to the fanout wiring F may be unnecessary. That is, it is possible to minimize a dead space.

The plurality of fanout wirings F may extend from the driving chip 20 of the subregion SR to the non-display area NDA of the main region MR.

The plurality of fanout wirings F may be electrically connected to the plurality of signal wirings DL, respectively. Some of the plurality of fanout wirings F may be directly connected to some of the plurality of signal wirings DL, and other of the plurality of fanout wirings F may be directly connected to the connecting wirings DM and be electrically connected to the signal wirings DL by the connecting wirings DM.

In an exemplary embodiment, as shown in FIG. 8, a first fanout wiring F1 may be directly connected to the first connecting wiring DM1 and be electrically connected to the first signal wiring DL1 by the first connecting wiring DM1, for example. A second fanout wiring F2 may be directly connected to the second connecting wiring DM2 and be electrically connected to the second signal wiring DL2 by the second connecting wiring DM2. A third fanout wiring F3 may be directly connected to the third signal wiring DL3. A fourth fanout wiring F4 may be directly connected to the fourth signal wiring DL4.

That is, the first fanout wiring F1 may be connected to the first subpixel R and the third subpixel B of the first pixel PX1, the second fanout wiring F2 may be connected to the second subpixel G of the first pixel PX1, the third fanout wiring F3 may be connected to the first subpixel R and the third subpixel B of the second pixel PX2, and the fourth fanout wiring F4 may be connected to the second subpixel G of the second pixel PX2.

In an exemplary embodiment, the second fanout wiring F2 and the third fanout wiring F3 may intersect with each other and be overlapped in a thickness direction. The second fanout wiring F2 and the third fanout wiring F3 may intersect with each other in the non-display area NDA of the main region MR. When the second fanout wiring F2 and the third fanout wiring F3 intersect with each other, fanout wirings including the same conductive layer may be applied to the subpixels R, G, and B which each emit the same color. Accordingly, since the fanout wirings connected to the same subpixels R, G, and B include different types of conductive layers to prevent a critical dimension ("CD") skew difference from being generated, luminance differences and color deviation between the same subpixels R, G, and B may be improved. That is, display quality of the display device may be improved.

Referring to FIGS. 8 to 12, the plurality of fanout wirings F may each include main fanout wirings 211, 121, 231, and 141, subfanout wirings 212, 122, 232, and 142 spaced apart from the main fanout wirings 211, 121, 231, and 141, and bent fanout wiring 410 which connects the main fanout wirings 211, 121, 231, and 141 to the subfanout wirings 212, 122, 232, and 142.

The main fanout wirings 211, 121, 231, and 141 may be arranged in the non-display area NDA of the main region MR. Some of the main fanout wirings 211, 121, 231, and 141 may intersect with each other and may be overlapped in a thickness direction. A detailed description thereof will be described below.

One ends of the main fanout wirings 211, 121, 231, and 141 may be connected to the connecting wirings DM1 and DM2 or the signal wirings DL3 and DL4, and the other ends of the main fanout wirings 211, 121, 231, and 141 may be connected to the bent fanout wiring 410.

The main fanout wirings 211, 121, 231, and 141 may be directly connected to the connecting wirings DM1 and DM2 or the signal wirings DL3 and DL4 on one side of the non-display area NDA of the main region MR.

The main fanout wirings 211, 121, 231, and 141 may be arranged in a layer different from a layer in which the connecting wirings DM1 and DM2 or the signal wirings DL3 and DL4 are disposed and may be insulated from the connecting wirings DM1 and DM2 or the signal wirings DL3 and DL4 by an insulating layer. Also, some of the main fanout wirings 211, 121, 231, and 141 may be arranged in different layers and be insulated from each other by an insulating layer.

In an exemplary embodiment, as shown in FIGS. 8 and 9, a first main fanout wiring 211 may be directly connected to the first connecting wiring DM1, for example. That is, the first main fanout wiring 211 may be electrically connected to the first subpixel R and the third subpixel B of the first pixel PX1.

The first main fanout wiring 211 may include a second conductive layer 200, the first connecting wiring DM1 may include the fourth conductive layer 400, and the first main fanout wiring 211 may be insulated from the first connecting wiring DM1 by a third insulating layer IL3 and the fourth insulating layer IL4. The first connecting wiring DM1 may be directly connected to the first main fanout wiring 211 through a contact hole which passes through the third insulating layer IL3 and the fourth insulating layer IL4 and exposes one end of the first main fanout wiring 211.

Also, as shown in FIGS. 8 and 10, a second main fanout wiring 121 may be directly connected to the second connecting wiring DM2. That is, the second main fanout wiring 121 may be electrically connected to the second subpixel G of the first pixel PX1.

The second main fanout wiring 121 may be disposed in a layer different from a layer in which the first main fanout wiring 211 is disposed. The second main fanout wiring 121 may include a first conductive layer 100, the second connecting wiring DM2 may include the fourth conductive layer 400, and the second main fanout wiring 121 may be insulated from the second connecting wiring DM2 by a second insulating layer IL2, the third insulating layer IL3, and the fourth insulating layer IL4. The second connecting wiring DM2 may be directly connected to the second main fanout wiring 121 through a contact hole which passes through the third insulating layer IL3 and the fourth insulating layer IL4 and exposes one end of the second main fanout wiring 121.

Also, as shown in FIGS. 8 and 11, a third main fanout wiring 231 may be directly connected to the third signal wiring DL3. That is, the third main fanout wiring 231 may be electrically connected to the first subpixel R and the third subpixel B of the second pixel PX2.

The third main fanout wiring 231 may be disposed in the same layer in which the first main fanout wiring 211 is disposed. Also, the third main fanout wiring 231 may be disposed in a layer different from the layer in which the second main fanout wiring 121 is disposed.

The third main fanout wiring 231 and the second main fanout wiring 121 may intersect with each other and be overlapped in a thickness direction. When the third main fanout wiring 231 and the second main fanout wiring 121 intersect with each other, fanout wirings including the same conductive layer may be applied to the subpixels R, G, and B which each emit the same color. In an exemplary embodiment, the fanout wirings F1 and F3 including the second conductive layer 200 may be applied to the first subpixels R and third subpixels B of the first pixel PX1 and the second pixel PX2, and the fanout wirings F2 and F4 including the first conductive layer 100 may be applied to the second subpixels G of the first pixel PX1 and the second pixel PX2, for example. Accordingly, since the fanout wirings connected to the same subpixels R, G, and B include different types of conductive layers to prevent a CD skew difference from being generated, luminance differences and color deviation between the same subpixels R, G, and B may be improved. That is, display quality of the display device may be improved.

The third main fanout wiring 231 may include the second conductive layer 200, the third signal wiring DL3 may include the third conductive layer 300, and the third main fanout wiring 231 may be insulated from the third signal wiring DL3 by the third insulating layer IL3. The third signal wiring DL3 may be directly connected to the third main fanout wiring 231 through a contact hole which passes through the third insulating layer IL3 and exposes one end of the third main fanout wiring 231.

Also, as shown in FIGS. 8 and 12, a fourth main fanout wiring 141 may be directly connected to the fourth signal wiring DL4. That is, the fourth main fanout wiring 141 may be electrically connected to the second subpixel G of the second pixel PX2.

The fourth main fanout wiring 141 may be disposed in the same layer in which the second main fanout wiring 121 is disposed. Also, the fourth main fanout wiring 141 may be disposed in a layer different from the layer in which the first main fanout wiring 211 is disposed. That is, the fourth main fanout wiring 141 may include the first conductive layer 100, the fourth signal wiring DL4 may include the third conductive layer 300, and the fourth main fanout wiring 141 may be insulated from the fourth signal wiring DL4 by the second insulating layer IL2 and the third insulating layer IL3. The fourth signal wiring DL4 may be directly connected to the fourth main fanout wiring 141 through a contact hole which passes through the second insulating layer IL2 and the third insulating layer IL3 and exposes one end of the fourth main fanout wiring 141.

The subfanout wirings 212, 122, 232, and 142 may be arranged in the subregion SR.

The subfanout wirings 212, 122, 232, and 142 may extend in the first direction DR1 and may be sequentially arranged at particular intervals along the second direction DR2. That is, a plurality of such subfanout wirings 212, 122, 232, and 142 may be arranged to be spaced apart from each other. That is, the plurality of subfanout wirings 212, 122, 232, and 142 may not overlap with each other in a thickness direction.

The subfanout wirings 212, 122, 232, and 142 may be arranged while being spaced apart from the main fanout wirings 211, 121, 231, and 141. The subfanout wirings 212, 122, 232, and 142 may be electrically connected to the main fanout wirings 211, 121, 231, and 141, respectively, by the bent fanout wiring 410 which will be described below. One ends of the subfanout wirings 212, 122, 232, and 142 may be connected to output terminals P1, P2, P3, and P4 of the driving chip 20, and the other ends of the subfanout wirings 212, 122, 232, and 142 may be connected to the bent fanout wiring 410. The subfanout wirings 212, 122, 232, and 142 may be arranged in the same layer in which the main fanout wirings 211, 121, 231, and 141 are arranged.

In an exemplary embodiment, as shown in FIGS. 8 and 9, one end of the first subfanout wiring 212 may be connected to the first output terminal P1, and the other end of the first subfanout wiring 212 may be connected to the bent fanout wiring 410, for example. That is, the first subfanout wiring 212 may be electrically connected to the first main fanout wiring 211 by the bent fanout wiring 410. The first subfanout wiring 212 may be disposed in the same layer in which the first main fanout wiring 211 is disposed. That is, the first subfanout wiring 212 may include the first conductive layer 100.

Also, as shown in FIGS. 8 and 10, one end of the second subfanout wiring 122 may be connected to the second output terminal P2, and the other end of the second subfanout wiring 122 may be connected to the bent fanout wiring 410. That is, the second subfanout wiring 122 may be electrically connected to the second main fanout wiring 121 by the bent fanout wiring 410. The second subfanout wiring 122 may be disposed in the same layer in which the second main fanout wiring 121 is disposed. That is, the second subfanout wiring 122 may include the second conductive layer 200.

Also, as shown in FIGS. 8 and 11, one end of the third subfanout wiring 232 may be connected to the third output terminal P3, and the other end of the third subfanout wiring 232 may be connected to the bent fanout wiring 410. That is, the third subfanout wiring 232 may be electrically connected to the third main fanout wiring 231 by the bent fanout wiring 410. The third subfanout wiring 232 may be disposed in the same layer in which the third main fanout wiring 231 is disposed. That is, the third subfanout wiring 232 may include the second conductive layer 200.

Also, as shown in FIGS. 8 and 12, one end of the fourth subfanout wiring 142 may be connected to the fourth output terminal P4, and the other end of the fourth subfanout wiring 142 may be connected to the bent fanout wiring 410. That is, the fourth subfanout wiring 142 may be electrically connected to the fourth main fanout wiring 141 by the bent fanout wiring 410. The fourth subfanout wiring 142 may be disposed in the same layer in which the fourth main fanout wiring 141 is disposed. That is, the fourth subfanout wiring 142 may include the first conductive layer 100.

The bent fanout wiring 410 may be disposed in the bent region BR. The bent fanout wiring 410 may extend in the first direction DR1 and may be sequentially arranged at particular intervals along the second direction DR2.

One end of the bent fanout wiring 410 may extend to the non-display area NDA of the main region MR and may be connected to the above-described main fanout wirings 211, 121, 231, and 141. The other end of the bent fanout wiring 410 may extend to the subregion SR and may be connected to the above-described subfanout wirings 212, 122, 232, and 142. That is, the main fanout wirings 211, 121, 231, and 141 and the subfanout wirings 212, 122, 232, and 142 may be connected by the bent fanout wiring 410, respectively.

The bent fanout wiring 410 may be disposed in a layer different from the layer in which the main fanout wirings 211, 121, 231, and 141 and the subfanout wirings 212, 122, 232, and 142 are arranged and may be insulated from the main fanout wirings 211, 121, 231, and 141 and the subfanout wirings 212, 122, 232, and 142 by an insulating layer. The bent fanout wiring 410 may be disposed in the same layer in which the above-described connecting wirings DM are disposed. That is, the bent fanout wiring 410 may include the fourth conductive layer 400.

In an exemplary embodiment, as shown in FIGS. 8 and 9, the bent fanout wiring 410 of the first fanout wiring F1 may connect the first main fanout wiring 211 to the first subfanout wiring 212, for example. The bent fanout wiring 410 may be insulated from the first main fanout wiring 211 and the first subfanout wiring 212 by the third insulating layer IL3 and the fourth insulating layer IL4. One end of the bent fanout wiring 410 may be connected to the first main fanout wiring 211 through a contact hole which passes through the third insulating layer IL3 and the fourth insulating layer IL4 and exposes one end of the first main fanout wiring 211. Also, the other end of the bent fanout wiring 410 may be connected to the first subfanout wiring 212 through a contact hole which passes through the third insulating layer IL3 and the fourth insulating layer IL4 and exposes one end of the first subfanout wiring 212.

Also, as shown in FIGS. 8 and 10, the bent fanout wiring 410 of the second fanout wiring F2 may connect the second main fanout wiring 121 to the second subfanout wiring 122. The bent fanout wiring 410 may be insulated from the second main fanout wiring 121 and the second subfanout wiring 122 by the second insulating layer IL2, the third insulating layer IL3 and the fourth insulating layer IL4. One end of the bent fanout wiring 410 may be connected to the second main fanout wiring 121 through a contact hole which passes through the second insulating layer IL2, the third insulating layer IL3, and the fourth insulating layer IL4 and exposes one end of the second main fanout wiring 121. The other end of the bent fanout wiring 410 may be connected to the second subfanout wiring 122 through a contact hole which passes through the second insulating layer IL2, the third insulating layer IL3, and the fourth insulating layer IL4 and exposes one end of the second subfanout wiring 122.

Also, as shown in FIGS. 8 and 11, the bent fanout wiring 410 of the third fanout wiring F3 may connect the third main fanout wiring 231 to the third subfanout wiring 232. The bent fanout wiring 410 may be insulated from the third main fanout wiring 231 and the third subfanout wiring 232 by the third insulating layer IL3 and the fourth insulating layer IL4. One end of the bent fanout wiring 410 may be connected to the third main fanout wiring 231 through a contact hole which passes through the third insulating layer IL3 and the fourth insulating layer IL4 and exposes one end of the third main fanout wiring 231. Also, the other end of the bent fanout wiring 410 may be connected to the third subfanout wiring 232 through a contact hole which passes through the third insulating layer IL3 and the fourth insulating layer IL4 and exposes one end of the third subfanout wiring 232.

Also, as shown in FIGS. 8 and 12, the bent fanout wiring 410 of the fourth fanout wiring F4 may connect the fourth main fanout wiring 141 to the fourth subfanout wiring 142. The bent fanout wiring 410 may be insulated from the fourth main fanout wiring 141 and the fourth subfanout wiring 142 by the second insulating layer IL2, the third insulating layer IL3, and the fourth insulating layer IL4. One end of the bent fanout wiring 410 may be connected to the fourth main fanout wiring 141 through a contact hole which passes through the second insulating layer IL2, the third insulating layer IL3, and the fourth insulating layer IL4 and exposes one end of the fourth main fanout wiring 141. Also, the other end of the bent fanout wiring 410 may be connected to the fourth subfanout wiring 142 through a contact hole which passes through the second insulating layer IL2, the third insulating layer IL3, and the fourth insulating layer IL4 and exposes one end of the fourth subfanout wiring 142.

As described above, the second fanout wiring F2 and the third fanout wiring F3 may intersect and be overlapped with each other in a thickness direction. In this case, the second fanout wiring F2 and the third fanout wiring F3 may intersect with each other in the main region MR. When the second fanout wiring F2 and the third fanout wiring F3 intersect with each other, fanout wirings including the same conductive layer may be applied to the subpixels R, G, and B which each emit the same color. In an exemplary embodiment, the fanout wirings F1 and F3 including the second conductive layer 200 may be applied to the first subpixels R and third subpixels B of the first pixel PX1 and the second pixel PX2, and the fanout wirings F2 and F4 including the first conductive layer 100 may be applied to the second subpixels G of the first pixel PX1 and the second pixel PX2, for example. Accordingly, since the fanout wirings connected to the same subpixels R, G, and B include different types of conductive layers to prevent a CD skew difference from being generated, luminance differences and color deviation between the same subpixels R, G, and B may be improved. That is, display quality of the display device may be improved.

The above-described subpixels R, G, and B, signal wirings DL, connecting wirings DM, and fanout wirings F are not limited to that shown in FIGS. 1 to 12 and may be diversely modifiable within a range in which fanout wirings including the same conductive layer are applied to the same subpixels R, G, and B of each of the pixels PX1 and PX2.

Hereinafter, a cross-sectional structure of the above-described subpixels R, G, and B will be described in detail. The cross-sectional structure of the subpixels R, G, and B will be described in detail with reference to FIG. 5. In FIG.

5, with respect to some components, the same components as the above-described components will be assigned with new additional reference numerals and parallel with existing reference numerals to clarify interlayer components.

Referring to FIG. 5, the subpixels R, G, and B may include a substrate 101, a buffer layer BF, a semiconductor layer ACT, a first insulating layer IL1, the first conductive layer 100, the second insulating layer IL2, the second conductive layer 200, the third insulating layer IL3, the third conductive layer 300, the fourth insulating layer IL4, the fourth conductive layer 400, a fifth insulating layer IL5, a first electrode layer 710, a pixel definition film 800 in which an opening portion exposing the first electrode layer 710 is defined, an emission layer 720 disposed in the opening portion of the pixel definition film 800, a second electrode layer 730 disposed on the emission layer 720 and the pixel definition film 800, and a passivation layer 900.

The above-described layers may each include a single film or include a deposition film including a plurality of films. Another layer may be further disposed between the layers.

The substrate 101 may support respective layers arranged thereon. The substrate 101 may include an insulating material. In an exemplary embodiment, the substrate 101 may include inorganic materials such as glass, quartz, and the like or may include organic materials such as polyimide and the like. The substrate 101 may be a rigid substrate or a flexible substrate.

The buffer layer BF is disposed on the substrate 101. The buffer layer BF may prevent impurity of ions from being diffused, prevent water penetration, and perform a surface planarization function. In an exemplary embodiment, the buffer layer BF may include silicon nitride, silicon oxide, silicon oxynitride, and the like.

The semiconductor layer ACT is disposed on the buffer layer BF. The semiconductor layer ACT forms channels of a plurality of transistors of the subpixels R, G, and B. In an exemplary embodiment, the semiconductor layer ACT may include polycrystal silicon. In an exemplary embodiment, the polycrystal silicon may be formed by crystallizing amorphous silicon, for example.

In the case of the semiconductor layer ACT including polycrystal silicon, when the semiconductor layer ACT is doped with ions, the ion-doped semiconductor layer ACT may have conductivity. Due to this, the semiconductor layer ACT may include not only channel areas of the plurality of transistors but also source areas and drain areas thereof. The source area and the drain area may be connected to both sides of each channel area.

In another exemplary embodiment, the semiconductor layer ACT may include single-crystal silicon, low-temperature polycrystal silicon, amorphous silicon, or an oxide semiconductor. In an exemplary embodiment, the oxide semiconductor may include, for example, a bicomponent-based compound (ABx), a tricomponent-based compound (ABxCy), and a quadracomponent-basd compound that include indium (In), zinc (Zn), gallium (Ga), tin (Sn), titanium (Ti), aluminum (Al), hafnium (H), zirconium (Zr), magnesium (Mg), and the like. In an exemplary embodiment, the semiconductor layer ACT may include indium tin zinc oxide ("ITZO") or indium gallium zinc oxide ("IGZO").

The first insulating layer IL1 is disposed on the semiconductor layer ACT. The first insulating layer IL1 may be generally disposed on an entire surface of the substrate 101. The first insulating layer IL1 may be a gate insulating film having a gate insulating function. The first insulating layer IL1 may include a silicon compound, metal oxide, and the like. In an exemplary embodiment, the first insulating layer IL1 may include silicon oxide, silicon nitride, silicon oxynitride, Al oxide, tantalum (Ta) oxide, Hf oxide, Zr oxide, Ti oxide, and the like, for example. The first insulating layer IL1 may be a single film or a multilayer film including deposition films of different materials.

The first conductive layer 100 is disposed on the first insulating layer IL1. In an exemplary embodiment, the first conductive layer 100 may include at least one metal selected from molybdenum (Mo), Al, platinum (Pt), palladium (Pd), silver (Ag), Mg, gold (Au), nickel (Ni), neodymium (Nd), iridium (Ir), chrome (Cr), calcium (Ca), Ti, Ta, tungsten (W), and copper (Cu). The first conductive layer 100 may be a single film or a multilayer film.

The first conductive layer 100 may include the second main fanout wiring 121, the second subfanout wiring 122, the fourth main fanout wiring 141, and the fourth subfanout wiring 142. Also, the first conductive layer 100 may include a gate electrode of a transistor and a first electrode of a hold-up capacitor.

The second insulating layer IL2 is disposed on the first conductive layer 100. The second insulating layer IL2 may be generally disposed on the entire surface of the substrate 101. The second insulating layer IL2 insulates the first conductive layer 100 from the second conductive layer 200.

The second insulating layer IL2 may be an interlayer insulating film. The second insulating layer IL2 may include the same material as that of the first insulating layer IL1 or may include one or more materials selected from the materials exemplified above as component materials of the first insulating layer IL1.

The second conductive layer 200 is disposed on the second insulating layer IL2. In an exemplary embodiment, the second conductive layer 200 may include at least one metal selected from Mo, Al, Pt, Pd, Ag, Mg, Au, Ni, Nd, Ir, Cr, Ca, Ti, Ta, W, and Cu.

The second conductive layer 200 may include the same material as that of the first conductive layer 100 but is not limited thereto. The second conductive layer 200 may be a single film or a multilayer film.

The second conductive layer 200 may include the first main fanout wiring 211, the first subfanout wiring 212, the third main fanout wiring 231, and the third subfanout wiring 232. Also, the second conductive layer 200 may include a second electrode of the hold-up capacitor. The second conductive layer 200 may form the hold-up capacitor by being overlapped with the first conductive layer 100 with the second insulating layer IL2 therebetween.

The third insulating layer IL3 covers the second conductive layer 200. The third insulating layer IL3 insulates the second conductive layer 200 from the third conductive layer 300. The third insulating layer IL3 may include the same material as that of the first insulating layer IL1 or may include one or more materials selected from the materials exemplified above as component materials of the first insulating layer IL1.

The third conductive layer 300 is disposed on the third insulating layer IL3. In an exemplary embodiment, the third conductive layer 300 may include at least one metal selected from Al, Mo, Pt, Pd, Ag, Mg, Au, Ni, Nd, Ir, Cr, Ca, Ti, Ta, W, and Cu. The third conductive layer 300 may be a single film or a multilayer film. In an exemplary embodiment, the third conductive layer 300 may have a deposition structure such as Ti/Al/Ti, Mo/Al/Mo, Mo/AlGe/Mo, Ti/Cu, and the like, for example.

The third conductive layer 300 may include the above-described signal wiring DL and a source electrode SE. The source electrode SE may be connected to the source area of the semiconductor layer ACT through a contact hole which passes through the third insulating layer IL3, the second insulating layer IL2, and the first insulating layer IL1.

The fourth insulating layer IL4 covers the third conductive layer 300. The fourth insulating layer IL4 may be a via layer. In an exemplary embodiment, the fourth insulating layer IL4 may include organic insulating materials such as polyacrylate resin, epoxy resin, phenolic resin, polyamide resin, polyimide resin, unsaturated polyester resin, poly phenylenether resin, polyphenylene sulfide resin, benzocyclobutene, and the like.

The fourth conductive layer 400 is disposed on the fourth insulating layer IL4. The fourth insulating layer IL4 may include the same material as that of the third conductive layer 300 or may include one or more materials selected from the materials exemplified above as component materials of the third conductive layer 300.

The fourth conductive layer 400 may include the above-described connecting wiring DM and bent fanout wiring 410. Also, the fourth conductive layer 400 may include a first conductive pattern CP1. The first conductive pattern CP1 may be connected to the source electrode SE through a contact hole which passes through the fourth insulating layer IL4.

The fifth insulating layer IL5 covers the fourth conductive layer 400. The fifth insulating layer IL5 may be a via layer. The fifth insulating layer IL5 may include the same material as that of the fourth insulating layer IL4 or may include one or more materials selected from the materials exemplified above as component materials of the fourth insulating layer IL4.

The first electrode layer 710 is disposed on the fifth insulating layer IL5. In an exemplary embodiment, the first electrode layer 710 may have a deposition film structure, in which a material layer having a high work function such as indium-tin-oxide ("ITO"), indium-zinc-oxide ("IZO"), zinc oxide (ZnO), and indium oxide (In2O3) and a reflective material layer such as Ag, Mg, Al, Pt, Pb, Au, Ni, Nd, Ir, Cr, lithium (Li), Ca, and a combination thereof are deposited, but is not limited thereto. The layer having the high work function may be disposed above the reflective material layer to be close to the emission layer 720. In an exemplary embodiment, the first electrode layer 710 may have a multilayer structure such as ITO/Mg, ITO/MgF, ITO/Ag, and ITO/Ag/ITO but is not limited thereto. An anode electrode of each of the subpixels R, G, and B may include the first electrode layer 710. The anode electrode may be connected to the first conductive pattern CP1 through a contact hole which passes through the fifth insulating layer IL5.

The pixel definition film 800 may be disposed on the first electrode layer 710. In an exemplary embodiment, the pixel definition film 800 may include inorganic insulating materials such as silicon oxide, silicon nitride, silicon oxynitride, Hf oxide, Al oxide, Ti oxide, Ta oxide, Zn oxide, and the like or organic insulating materials such as polyacrylate resin, epoxy resin, phenolic resin, polyamide resin, polyimide resin, unsaturated polyester resin, poly phenylenether resin, polyphenylene sulfide resin, benzocyclobutene ("BCB"), and the like. The pixel definition film 800 may be a single film or a multilayer film including deposition films of different materials.

An opening portion which exposes the first electrode layer 710 may be defined in the pixel definition film 800. The opening portion may define an emission area of each of the subpixels R, G, and B. The emission layer 720 is disposed in the opening portion of the pixel definition film 800. The emission layer 720 may include an organic emission layer, a hole injection/transport layer, and an electron injection/transport layer.

The second electrode layer 730 is disposed on the emission layer 720 and the pixel definition film 800. A cathode may include the second electrode layer 730. The cathode electrode may be disposed on an entirety of the display area DA. In an exemplary embodiment, the second electrode layer 730 may include a material layer having a low work function such as Li, Ca, LiF/Ca, LiF/Al, Al, Mg, Ag, Pt, Pd, Ni, Au, Nd, Ir, Cr, BaF, Ba, a compound thereof, or a combination thereof (for example, a combination of Ag and Mg). The second electrode layer 730 may further include a transparent metal oxide layer disposed on the material layer having the low work function.

The passivation layer 900 may be disposed on the second electrode layer 730. The passivation layer 900 may prevent humidity, oxygen, or the like from penetrating into the emission layer 720. In an exemplary embodiment, the passivation layer 900 may include at least one inorganic film and/or organic film. In an exemplary embodiment, the inorganic film may include, for example, one or more inorganic materials from AlxOy, TiOx, ZrOx, SiOx, AlOxNy, AlxNy, SiOxNy, SixNy, ZnOx, and TaxOy. In an exemplary embodiment, the organic film may be manufactured through polymerization of at least one monomer selected from the group including pentabromophenyl acrylate, 2-(9H-Carbazol-9-yl) ethyl methacrylate, N-vinylcarbazole, Bis (methacryloylthiophenyl) sulfide, and Zr acrylate. The organic film may be a planarization film.

Hereinafter, other exemplary embodiments will be described. Hereinafter, the same components as the above-described components will be referred to with the same reference numerals, and a repetitive description will be omitted or simplified.

Figure 13:
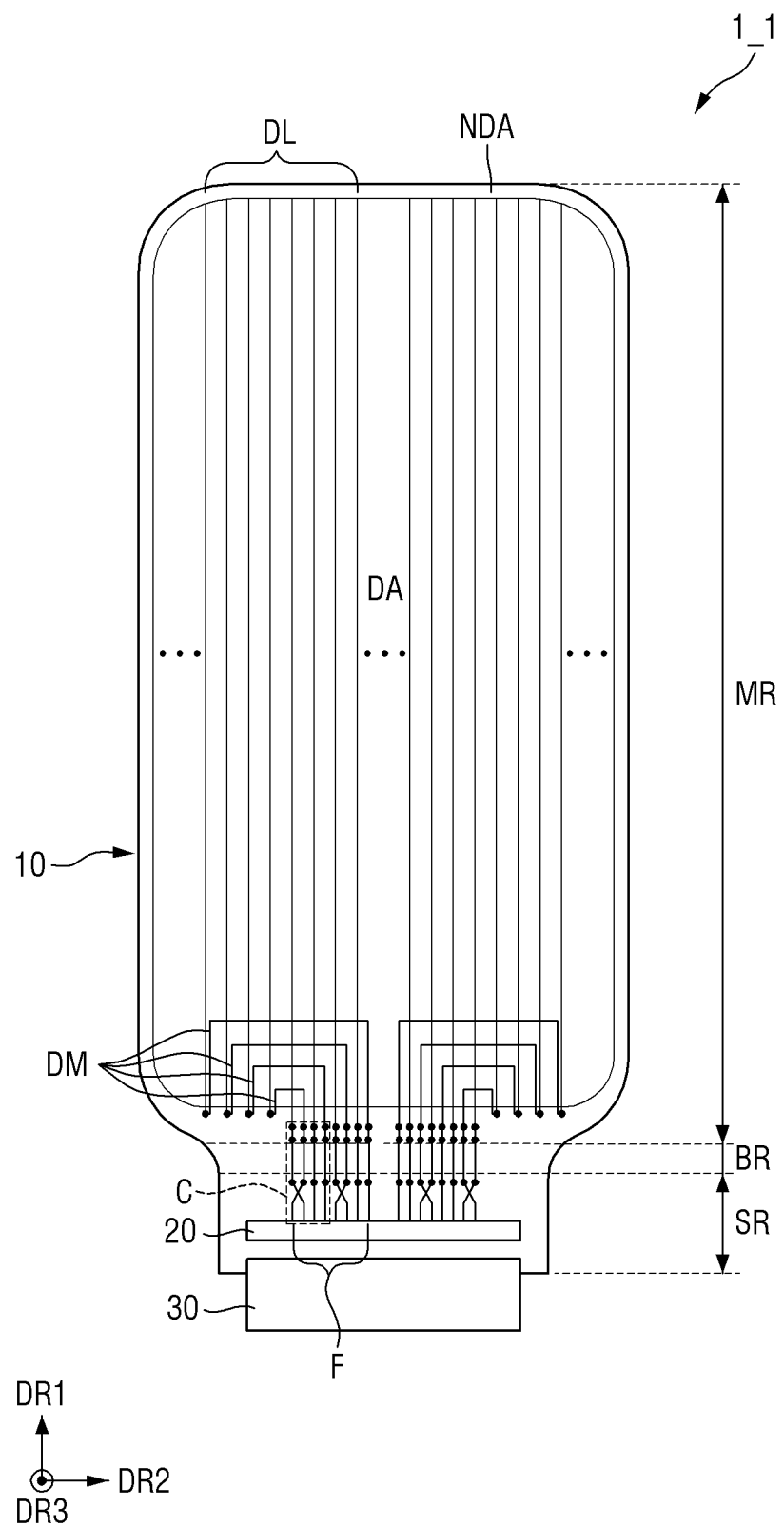
FIG. 13 is a plan view illustrating another exemplary embodiment of signal wirings, connecting wirings, and fanout wirings of a display device according to the invention.
Figure 14:
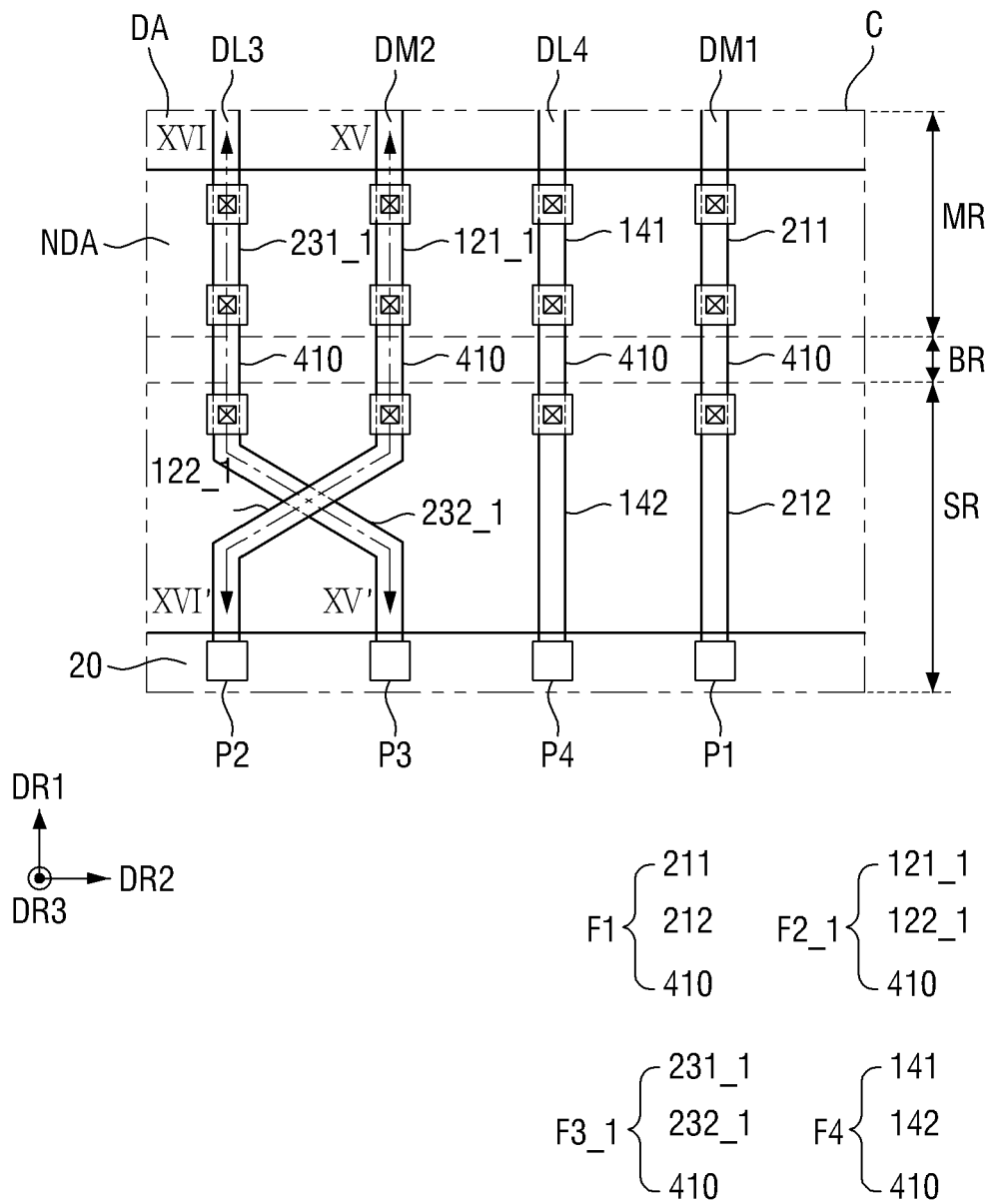
FIG. 14 is an enlarged plan view illustrating area C of FIG. 13.
Figure 15:
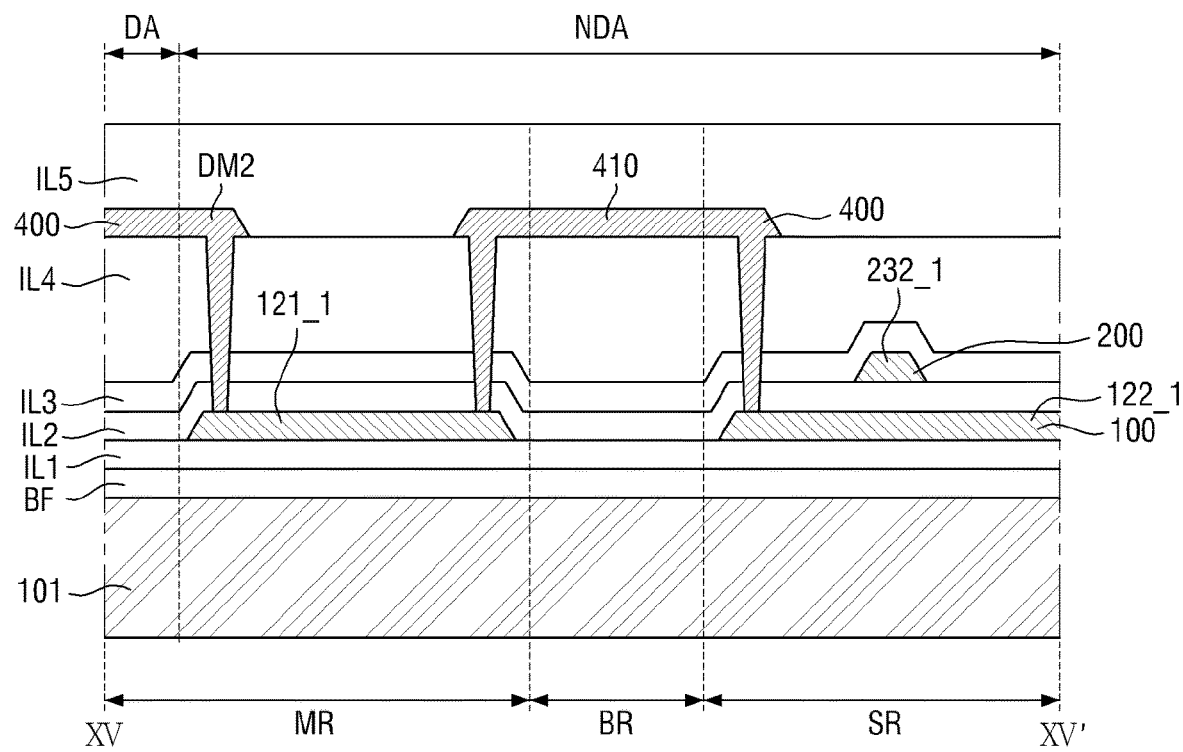
FIG. 15 is a cross-sectional view taken along line XV-XV' of FIG. 14.
Figure 16:
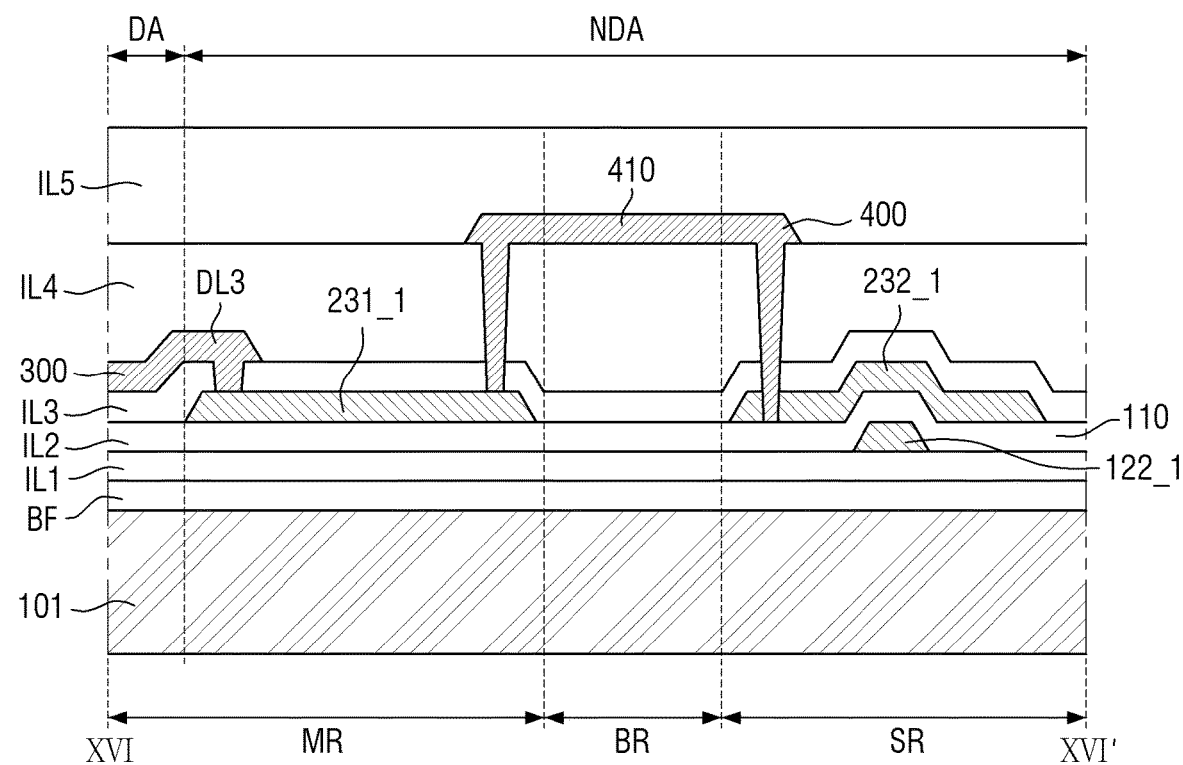
FIG. 16 is a cross-sectional view taken along line XVI-XVI' of FIG. 14.

FIG. 13 is a plan view illustrating another exemplary embodiment of signal wirings, connecting wirings, and fanout wirings of a display device according to the invention. FIG. 14 is an enlarged plan view illustrating area C of FIG. 13. FIG. 15 is a cross-sectional view taken along line XV-XV' of FIG. 14. FIG. 16 is a cross-sectional view taken along line XVI-XVI' of FIG. 14.

Referring to FIGS. 13 to 16, a display device 1_1 in the exemplary embodiment has a difference from the exemplary embodiments of FIGS. 1 to 12 in which the fanout wirings F intersect with each other in the subregion SR.

In detail, main fanout wirings 211, 1211, 231_1, and 141 of the fanout wirings F may be arranged in the non-display area NDA of the main region MR. The main fanout wirings 211, 1211, 231_1, and 141 may extend in the first direction DR1 and may be sequentially arranged at particular intervals along the second direction DR2. That is, a plurality of such main fanout wirings 211, 1211, 2311, and 141 may be arranged to be spaced apart from each other. That is, the plurality of main fanout wirings 211, 121_1, 231_1, and 141 may nonoverlap with each other in a thickness direction.

Since the main fanout wirings 211, 1211, 231_1, and 141 have interlayer components substantially equal to those of the main fanout wirings 211, 121, 231, and 141 described above with reference to FIGS. 1 to 12 except being arranged to be spaced apart from each other, a repetitive description will be omitted.

Subfanout wirings 212, 1221, 232_1, and 142 of the fanout wirings F may be arranged in the subregion SR. Some of the subfanout wirings 212, 1221, 2321, and 142 may intersect with each other and may be overlapped in a thickness direction.

In detail, the first subfanout wiring 212 may be connected to the first subpixel R and the third subpixel B of the first pixel PX1, a second subfanout wiring 122_1 may be connected to the second subpixel G of the first pixel PX1, a third subfanout wiring 232_1 may be connected to the first subpixel R and the third subpixel B of the second pixel PX2, and the fourth subfanout wiring 142 may be connected to the second subpixel G of the second pixel PX2.

The second subfanout wiring 122_1 and the third subfanout wiring 232_1 may intersect with each other and be overlapped in a thickness direction. When the second subfanout wiring 122_1 and the third subfanout wiring 232_1 intersect with each other, fanout wirings including the same conductive layer may be applied to the subpixels R, G, and B which each emit the same color. In an exemplary embodiment, fanout wirings F1 and F3_1 including the second conductive layer 200 may be applied to the first subpixels R and third subpixels B of the first pixel PX1 and the second pixel PX2, and fanout wirings F2_1 and F4 including the first conductive layer 100 may be applied to the second subpixels G of the first pixel PX1 and the second pixel PX2. Accordingly, as described above, since the fanout wirings connected to the same subpixels R, G, and B include different types of conductive layers to prevent a CD skew difference from being generated, luminance differences and color deviation between the same subpixels R, G, and B may be improved.

Since the first subfanout wiring 212 and the fourth subfanout wiring 142 have been described with reference to FIGS. 1 to 12, a repetitive description thereof will be omitted.

The bent fanout wiring 410 of the fanout wirings F may be disposed in the bent region BR. One end of the bent fanout wirings 410 may extend to the non-display area NDA of the main region MR and may be connected to the above-described main fanout wirings 211, 1211, 231_1, and 141. The other end of the bent fanout wirings 410 may extend to the subregion SR and may be connected to the above-described subfanout wirings 212, 122_1, 232_1, and 142. That is, the main fanout wirings 211, 1211, 231_1, and 141 and the subfanout wirings 212, 1221, 2321, and 142 may be connected by the bent fanout wiring 410, respectively.

Since the bent fanout wiring 410 has been described with reference to FIGS. 1 to 12, a repetitive description thereof will be omitted.

The above-described subpixels R, G, and B, signal wirings DL, connecting wirings DM, and fanout wirings F are not limited to that shown in FIGS. 13 to 16 and may be diversely modifiable within a range in which fanout wirings including the same conductive layer are applied to the same subpixels R, G, and B of each of the pixels PX1 and PX2, which each emit the same color.

Figure 17:
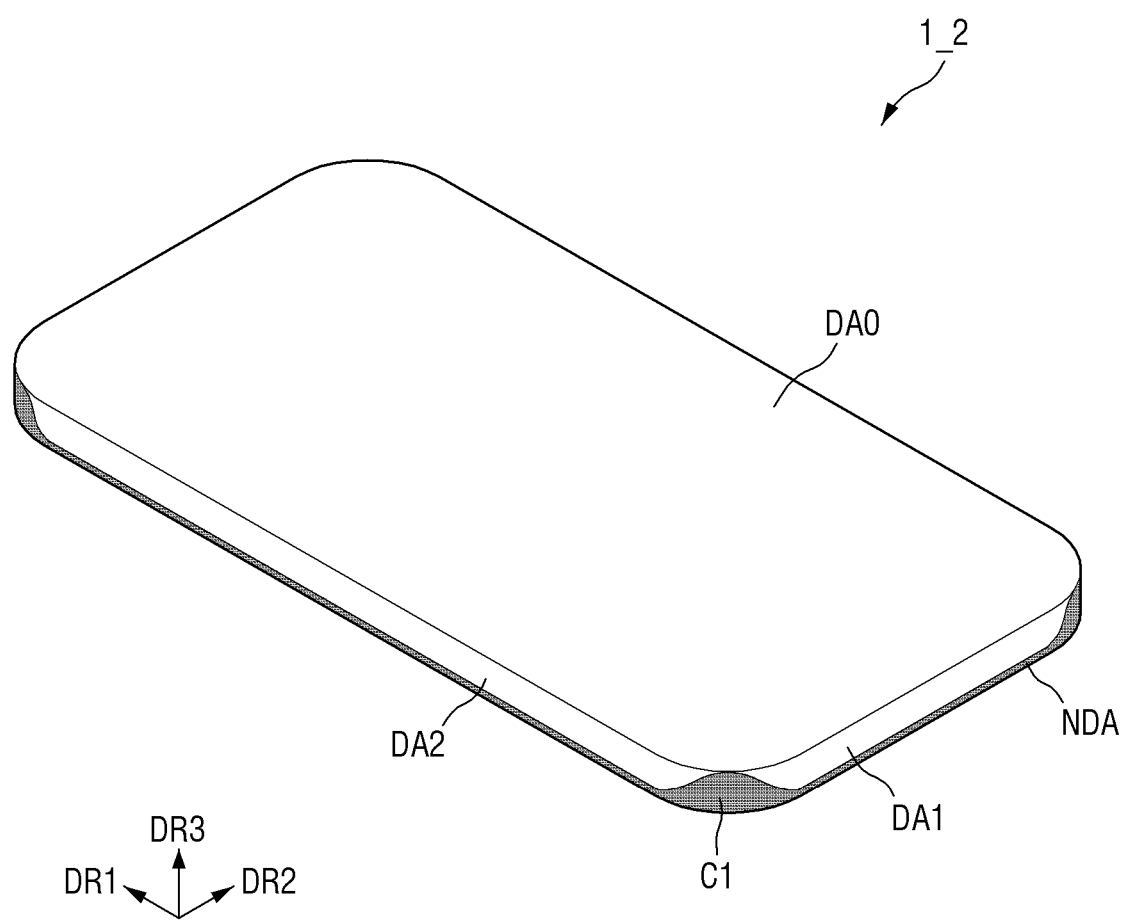
FIG. 17 is a perspective view of another exemplary embodiment of a display device according to the invention.
Figure 18:
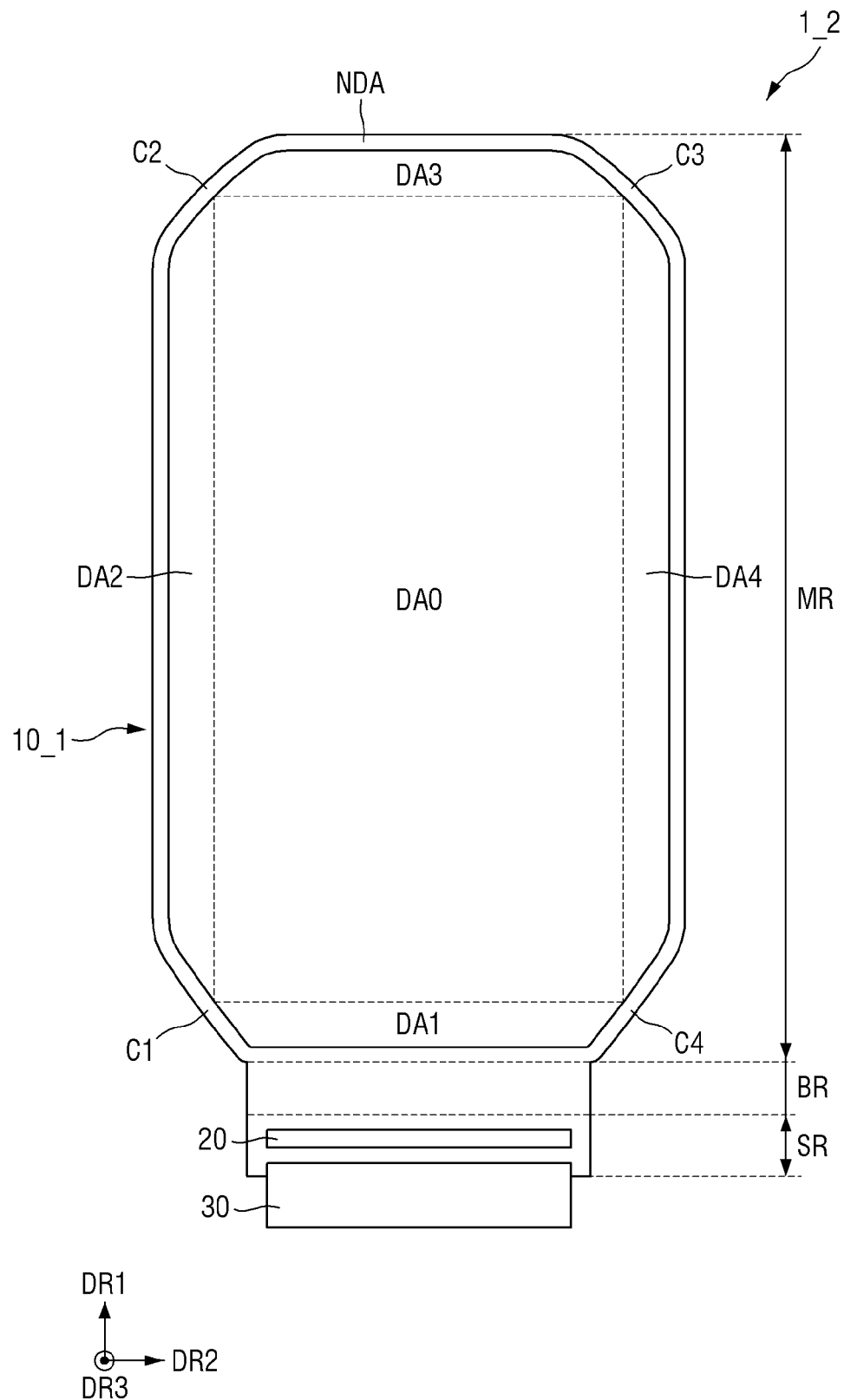
FIG. 18 is a development view of the display device of FIG. 17.
Figure 19:
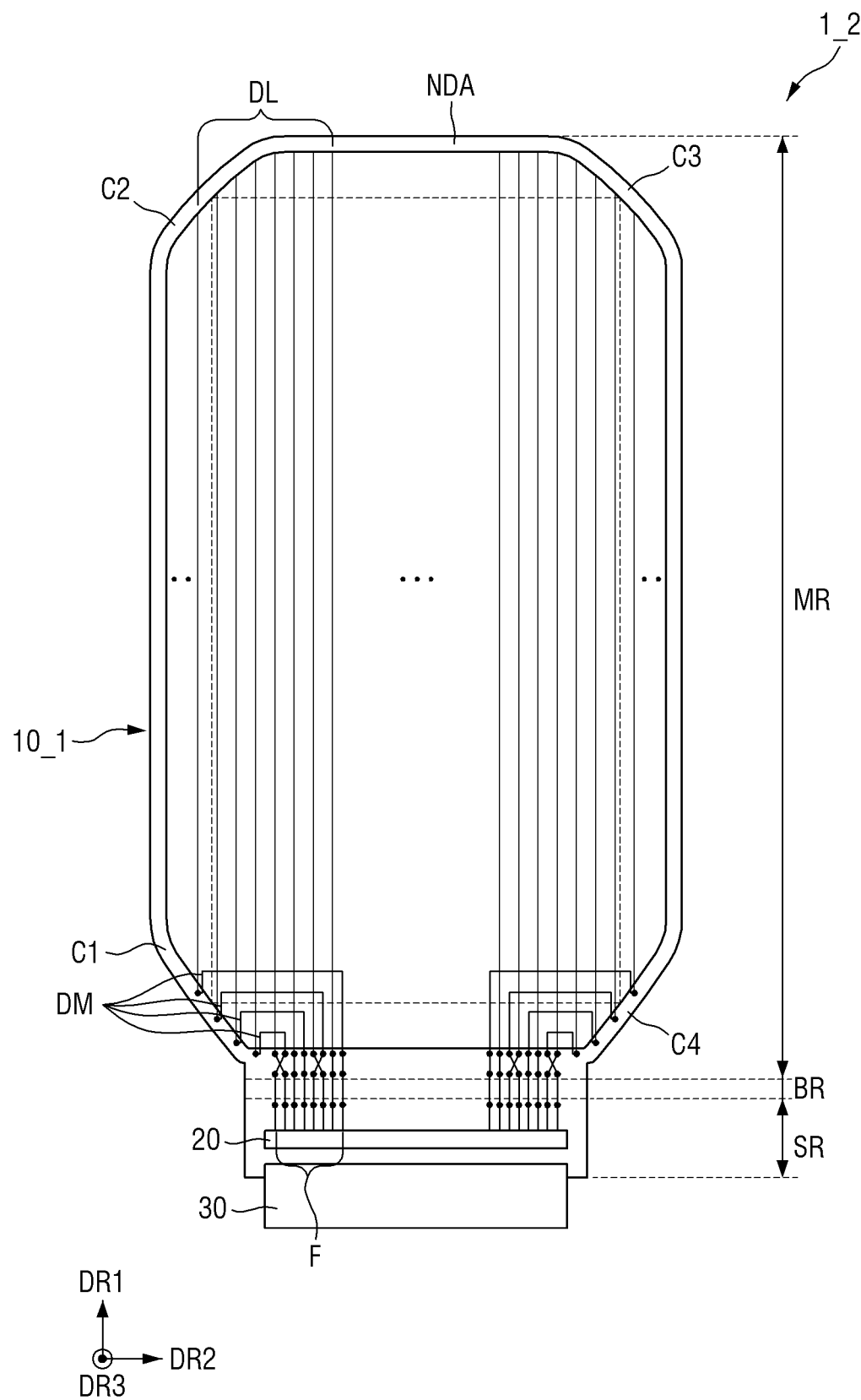
FIG. 19 is a development view illustrating signal wirings, connecting wirings, and fanout wirings of the display device of FIG. 17.

FIG. 17 is a perspective view of another exemplary embodiment of a display device according to the invention. FIG. 18 is a development view of the display device of FIG. 17. FIG. 19 is a development view illustrating signal wirings, connecting wirings, and fanout wirings of the display device of FIG. 17.

Referring to FIGS. 17 to 19, a display device 1_2 in the exemplary embodiment has a difference from the exemplary embodiments of FIGS. 1 to 12 in which a main region MR of a display panel 10_1 includes a front display area DA0, side display areas DA1, DA2, DA3, and DA4 and corner areas C1, C2, C3, and C4.

The front display area DA0 and the side display areas DA1, DA2, DA3, and DA4 may be a display area DA which displays an image. The corner areas C1, C2, C3, and C4 are non-display areas NDA which do not display an image and may provide a space through which signal wirings DL, the connecting wirings DM, and the like pass.

The front display area DA0 may have a rectangular shape including two long sides extending in the first direction DR1 and two short sides extending in the second direction DR2. However, the front display area DA0 is not limited thereto and may have a polygonal shape with rounded corners at which the short sides meet the long sides.

The side display areas DA1, DA2, DA3, and DA4 may include a first side display area DAL, a second side display area DA2, a third side display area DA3, and a fourth side display area DA4.

The first side display area DA1 may extend from an edge of the front display area DA0 in a direction opposite to the first direction DR1, the second side display area DA2 may extend from an edge of the front display area DA0 in a direction opposite to the second direction DR2, the third side display area DA3 may extend from an edge of the front display area DA0 in the first direction DR1, and the fourth side display area DA4 may extend from an edge of the front display area DA0 in the second direction DR2.

The first to fourth side display areas DA1, DA2, DA3, and DA4 may have substantially equal functions or components except for positions thereof. Hereinafter, common features of the first to fourth side display areas DA1, DA2, DA3, and DA4 will be described on the basis of the first side display area DA1, and a repetitive description will be omitted.

The first side display area DA1 may extend outward from the edge of the front display area DA0 and be bent by a predetermined angle. In an exemplary embodiment, the first side display area DA1 may be bent from the front display area DA0 by an angle of about 90 degrees (°) or more and about 150° or less, for example.

The first side display area DA1 may be connected to a bent region BR. As shown in FIG. 19, when the first side display area DA1 is curved or bent perpendicularly on the basis of the front display area DA0, the bent region BR is curved or bent once more perpendicularly on the basis of the first side display area DA1 (that is, curved or bent by an angle of about 180° on the basis of the front display area DA0) such that a subregion SR disposed on one side of the bent region BR may be disposed below the front display area DA0 in a thickness direction of the front display area DA0. The subregion SR may be overlapped with the front display area DA0 and may be disposed to be parallel to the front display area DA0.

The corner areas C1, C2, C3, and C4 may be disposed between the side display areas DAL, DA2, DA3, and DA4. The corner areas C1, C2, C3, and C4 may include first to fourth corner areas C1, C2, C3, and C4 each disposed between the first to fourth side display areas DA1, DA2, DA3, and DA4. The first to fourth corner areas C1, C2, C3, and C4 may be arranged to be close to four corners at which long sides and short sides of the front display area DA0 meet each other. The first to fourth corner areas C1, C2, C3, and C4 may have substantially equal functions or components except for positions thereof. Hereinafter, common features of the first to fourth corner areas C1, C2, C3, and C4 will be described on the basis of the first corner area C1, and repetitive descriptions will be omitted.

The first corner area C1 may be disposed between the first side display area DA1 and the second side display area DA2. One end of the first corner area C1 may contact the first side display area DA1, and the other end of the first corner area C1 may contact the second side display area DA2.

The first corner area C1 may extend from the front display area DA0 and be formed to be rounded with a predetermined curvature. The curvature formed by the first corner area C1 and the front display area DA0 may be greater than a curvature formed by the front display area DA0 and each of the first side display area DA1 and the second side display area DA2.

The first corner area C1 may provide a space in which signal wirings DL may be connected to connecting wirings DM.

A plurality of signal wirings DL may extend from the first corner area C1 and be arranged in the side display areas DA1, DA2, DA3, and DA4 and the front display area DA0. Also, the signal wirings DL may extend from a non-display area NDA between the first side display area DA1 and the bent region BR and be arranged in the side display areas DA1, DA2, DA3, and DA4 and the front display area DA0.

A plurality of connecting wirings DM may extend from the non-display area NDA between the first side display area DA1 and the bent region BR to the first corner area C1 via the first side display area DA1, the front display area DA0, or the second side display area DA2.

The plurality of connecting wirings DM may be electrically connected to the plurality of signal wirings DL, respectively, in the first corner area C1. Also, the connecting wirings DM may be electrically connected to the plurality of signal wirings DL, respectively, in the non-display area NDA between the first side display area DA1 and the bent region BR.

As described above, the display device 1_1 may include the connecting wiring DM which is disposed via the display area DA, and an image signal may be provided to the signal wiring DL through the connecting wiring DM. Accordingly, as described above, an additional dead space desired to directly connect the signal wiring DL to the fanout wiring F may be unnecessary.

The plurality of fanout wirings F may extend from the driving chip 20 of the subregion SR to the non-display area NDA of the main region MR.

The plurality of fanout wirings F may be electrically connected to the plurality of signal wirings DL, respectively. Some of the plurality of fanout wirings F may be directly connected to some of the plurality of signal wirings DL, and other of the plurality of fanout wirings F may be directly connected to the connecting wirings DM and electrically connected to the signal wirings DL by the connecting wirings DM.

Some of the plurality of fanout wirings F may intersect with each other and be overlapped in a thickness direction. When some of the fanout wirings F intersect with each other, fanout wirings of the same conductive layer may be applied to each of the subpixels which each emit the same color. Accordingly, as described above, since the fanout wirings connected to the same subpixels R, G, and B include different types of conductive layers to prevent a CD skew difference from being generated, luminance differences and color deviation between the same subpixels R, G, and B may be improved.

Although it is shown in the drawings that the plurality of fanout wirings F intersect with each other in the non-display area NDA of the main region MR, the invention is not limited thereto. That is, as shown in FIG. 13, the plurality of fanout wirings F may intersect with each other in the subregion SR.

In addition, since the signal wirings DL, the connecting wirings DM, and the fanout wirings F have been described with reference to FIGS. 1 to 12, repetitive descriptions will be omitted.

According to some exemplary embodiments, a display device may minimize a non-display area of the display device by arranging connecting wirings in a display area.

Also, fanout wirings including the same conductive layer may be applied to subpixels which each emit the same color by allowing fanout wirings connected to the connecting wirings to intersect with fanout wirings connected to signal wirings. Accordingly, since the fanout wirings connected to the same subpixels include different types of conductive layers to prevent a CD skew difference from being generated, luminance differences and color deviation between the same subpixels R, G, and B may be improved. That is, display quality of the display device may be improved.

Although the exemplary embodiments of the invention have been described with reference to the accompanying drawings, it will be understood by those of ordinary skill in the art to which the invention pertains that the invention may be implemented in other specific forms without departing from the spirit and essential characteristics of the invention. It is therefore to be understood that the exemplary embodiments described above are illustrative and should not be construed as limiting the invention.

Effects of the exemplary embodiments of the invention are not restricted by the above exemplified content, and a variety of effects are included in the specification.

What is claimed is:

1. A display device, which comprises a display area and a non-display area, comprising:
   a first pixel and a second pixel arranged in the display area;
   first to fourth signal wirings arranged in the display area;
   a first main fanout wiring and a second main fanout wiring arranged in the non-display area and electrically connected to the first and second signal wirings, respectively;
   a first connecting wiring including a portion disposed in the display area, the first connecting wiring connecting the first signal wiring to the first main fanout wiring; and
   a second connecting wiring including a portion disposed in the display area, the second connecting wiring connecting the second signal wiring to the second main fanout wiring,
   wherein the first pixel and the second pixel each comprise a first subpixel which emits a first color and a second subpixel which emits a second color different from the first color,
   wherein the first signal wiring is connected to the first subpixel of the first pixel,
   wherein the second signal wiring is connected to the second subpixel of the first pixel,
   wherein the third signal wiring is connected to the first subpixel of the second pixel,
   wherein the fourth signal wiring is connected to the second subpixel of the second pixel,
   wherein the first main fanout wiring is disposed in a first layer, and
   wherein the second main fanout wiring is disposed in a second layer different from the first layer.

2. The display device of claim 1, further comprising a third main fanout wiring and a fourth main fanout wiring arranged in the non-display area and electrically connected to the third and fourth signal wirings, respectively,
  wherein the third main fanout wiring is disposed in the first layer, and
  wherein the fourth main fanout wiring is disposed in the second layer.

3. The display device of claim 2, wherein the third signal wiring directly contacts the third main fanout wiring, and
  wherein the fourth signal wiring directly contacts the fourth main fanout wiring.

4. The display device of claim 2, wherein the first pixel and the second pixel each further comprise a third subpixel which emits a third color different from the first color and the second color,
  wherein the first signal wiring is connected to the third subpixel of the first pixel, and
  wherein the third signal wiring is connected to the third subpixel of the second pixel.

5. The display device of claim 4, wherein the first signal wiring and the third signal wiring are not connected any subpixel which emits the second color, and
  wherein the second signal wiring and the fourth signal wiring are not connected any subpixel which emits the first color or the third color.

6. The display device of claim 2, further comprising:
  first to fourth sub fanout wirings disposed in the non-display area,
  wherein the first to fourth sub fanout wirings are spaced apart from and electrically connected to the first to fourth main fanout wirings, respectively.

7. The display device of claim 6,
  wherein the first sub fanout wiring and the third sub fanout wiring are disposed in the first layer, and
  wherein the second sub fanout wiring and the fourth sub fanout wiring are disposed in the second layer.

8. The display device of claim 7,
  wherein the second sub fanout wiring and the third sub fanout wiring intersect and are overlapped with each other in a thickness direction.

9. The display device of claim 7, further comprising:
  a first bent fanout wiring which connects the first main fanout wiring and the first sub fanout wiring;
  a second bent fanout wiring which connects the second main fanout wiring and the second sub fanout wiring;
  a third bent fanout wiring which connects the third main fanout wiring and the third sub fanout wiring; and
  a fourth bent fanout wiring which connects the fourth main fanout wiring and the fourth sub fanout wiring.

10. The display device of claim 9, wherein the first bent fanout wiring, the second bent fanout wiring, the third bent fanout wiring and the fourth bent fanout wiring are disposed in a third layer different from the first layer and the second layer.

11. The display device of claim 10, wherein the first connecting wiring and the second connecting wiring are disposed in the third layer.

12. The display device of claim 2, wherein the first signal wiring, the second signal wiring, the third signal wiring and the fourth signal wiring are sequentially arranged along a first direction.

13. The display device of claim 12, wherein the second main fanout wiring, the third main fanout wiring signal wiring, the fourth main fanout wiring and the first main fanout wiring are sequentially arranged along the first direction.

14. The display device of claim 1, wherein the first connecting wiring and the second connecting wiring are disposed in a third layer different from the first layer and the second layer, and
  wherein the first signal wiring, the second signal wiring, the third signal wiring and the fourth signal wiring are disposed in a fourth layer different from the first layer, the second layer and the third layer.

15. The display device of claim 14, further comprising:
  a first insulating layer disposed between the first layer and the second layer; and
  a second insulating layer disposed between the third layer and the fourth layer.

16. The display device of claim 15, further comprising:
  a third insulating layer;
  wherein the fourth layer is disposed between the third layer and the second layer, and
  wherein the third insulating layer is disposed between the second layer and the fourth layer.

17. The display device of claim 1, wherein the first connecting wiring overlaps the second signal wiring, the third signal wiring and the fourth signal wiring in the display area.

18. The display device of claim 17, wherein the second connecting wiring overlaps the third signal wiring in the display area.

19. The display device of claim 18, wherein the second connecting wiring does not overlap the first signal wiring and the fourth signal wiring in the display area.

* * * * *